United States Patent [19]

Sakamoto

[11] Patent Number: 4,978,918

[45] Date of Patent: Dec. 18, 1990

[54] MAGNETIC RESONANCE IMAGING METHOD

[75] Inventor: Hidenobu Sakamoto, Amagasaki, Japan

[73] Assignee: Mitsubishi Denki Kabushiki Kaisha, Japan

[21] Appl. No.: 349,213

[22] Filed: May 9, 1989

[30] Foreign Application Priority Data

Apr. 24, 1988 [JP] Japan .................. 63-103744
May 16, 1988 [JP] Japan .................. 63-116933
Jul. 18, 1988 [JP] Japan .................. 63-176994
Sep. 16, 1988 [JP] Japan .................. 63-229850

[51] Int. Cl.$^5$ .......................... G01R 33/20
[52] U.S. Cl. ......................... 324/309; 324/306
[58] Field of Search ............ 128/653; 324/300, 307, 324/309, 311, 312, 306, 318, 322

[56] References Cited

U.S. PATENT DOCUMENTS

| | | | |
|---|---|---|---|
| 4,595,879 | 6/1986 | Lent et al. | 324/306 |
| 4,616,180 | 10/1986 | Compton | 324/309 |
| 4,673,880 | 6/1987 | Compton | 324/309 |
| 4,714,081 | 12/1987 | Dumoulin et al. | |
| 4,777,957 | 10/1988 | Wehrli et al. | 324/309 |
| 4,796,635 | 1/1989 | Dumoulin | 324/309 |
| 4,800,889 | 1/1989 | Dumoulin | 324/306 |
| 4,849,697 | 7/1989 | Cline et al. | 324/306 |

Primary Examiner—Michael J. Tokar

[57] ABSTRACT

In a method of magnetic resonance imaging in which an RF magnetic field pulse, a slice magnetic field, a phase encoding magnetic field and a signal reading magnetic field are applied to a sample in a predetermined sequence for the construction of desired slice image on the basis of a magnetic resonance signal from the sample, artifacts due to moving parts of the sample under examination are removed by specific combinations of the magnetic fields.

11 Claims, 19 Drawing Sheets

FIG. 11
PRIOR ART

| ORDER OF SIGNAL COLLECTION | PHASE ENCODE COEFFICIENT |
|---|---|
| 1 | $\frac{N}{2} / \frac{N}{2}$ |
| 2 | $(\frac{N}{2} - 1)/\frac{N}{2}$ |
| 3 | $(\frac{N}{2} - 2)/\frac{N}{2}$ |
| ⋮ | ⋮ |
| i | $(\frac{N}{2} + 1 - i)/\frac{N}{2}$ |
| ⋮ | ⋮ |
| N - 2 | $(-\frac{N}{2} - 3)/\frac{N}{2}$ |
| N - 1 | $(-\frac{N}{2} - 2)/\frac{N}{2}$ |
| N | $(-\frac{N}{2} - 1)/\frac{N}{2}$ |

FIG.13

| ORDER OF SIGNAL COLLECTION | PHASE ENCODE COEFFICIENT $i'$ |
|---|---|
| 1 | $\alpha_1 \cdot \frac{N}{2} / \frac{N}{2}$ |
| 2 | $\alpha_2 \cdot (\frac{N}{2} - 1) / \frac{N}{2}$ |
| 3 | $\alpha_3 \cdot (\frac{N}{2} - 2) / \frac{N}{2}$ |
| ⋮ | ⋮ |
| $i$ | $\alpha_i \cdot (\frac{N}{2} + 1 - i) / \frac{N}{2}$ |
| ⋮ | ⋮ |
| N − 2 | $\alpha_{N-2} \cdot (-\frac{N}{2} - 3) / \frac{N}{2}$ |
| N − 1 | $\alpha_{N-1} \cdot (-\frac{N}{2} - 2) / \frac{N}{2}$ |
| N | $\alpha_N \cdot (-\frac{N}{2} - 1) / \frac{N}{2}$ |

$$\alpha_i = \frac{1}{1 + \frac{Lb}{Lo} f((i-1)TR, to, Tb)}$$

MAGNETIC RESONANCE IMAGING METHOD

BACKGROUND OF THE INVENTION

The present invention relates to a magnetic resonance imaging method for obtaining slice images using NMR (nuclear magnetic resonance), ESR (electron spin resonance) and the like.

The present invention relates, more particularly, to an improvement for restraining artifacts due to moving parts in a sample, e.g., a patient.

The present invention also relates to reduction of artifacts due to body movement of the sample.

The present invention also relates to a magnetic resonance imaging method for imaging the movement such as flow velocity and flow rate.

FIG. 1 is a block diagram showing a typical magnetic resonance (MR) imaging system. As illustrated, it comprises a static magnetic field generator 2 for applying a static magnetic field in the Z-axis to a sample 1, such as a patient to be examined, and a diagnosis table 3 for moving the sample into the static magnetic field generator 2.

The imaging system further comprises an RF (radio frequency) coil 4 for applying an RF energy such as an RF magnetic pulse to the sample 1 and receiving an MR signal from the sample 1, a matching device 5 which converts the impedance of the RF coil 4, a transmit/-receive switch 6 connected to the matching device 5, a transmitter 7 for applying an RF energy to the sample 1 through the transmit/receive switch 6 and the RF coil 4, and a receiver 8 for receiving the MR signal from the sample 1 through the RF coil 4 and the transmit-receive switch 6.

The imaging system further comprises an X-axis gradient magnetic-field coil 9 for applying a magnetic field pulse inclined in the direction of the X-axis, an X-axis gradient magnetic-field power supply 10 for energizing the X-axis gradient magnetic-field coil 9, a Y-axis gradient magnetic-field coil 11 for applying a magnetic field pulse inclined in the direction of the Y-axis, a Y-axis gradient magnetic-field power supply 12 for energizing the Y-axis gradient magnetic-field coil 11, a Z-axis gradient magnetic-field coil 13 for applying a magnetic field pulse inclined in the direction of the Z-axis, and a Z-axis gradient magnetic-field power supply 14 for energizing the Z-axis gradient magnetic-field coil 13.

A sequence controller 15 is provided for controlling the transmitter 7, the receiver 8 and the gradient magnetic field power supplies 10, 12 and 14 with a predetermined sequence, and controlling various operations of the entire system, such as irradiation of the RF pulses, reception of the MR signals, generation of the gradient magnetic fields Gs, Gr and Ge, and operation of the diagnosis table 3.

A computer 16 is connected to the the receiver 8 and the sequence controller 15 and generates control data for generation of the image construction, and performs processing of the MR signals from the receiver 8 and processing for the image construction by means of, for example, two-dimensional Fourier transformation.

A console panel 17 serves as an input/output terminal for manually inputting, into the computer 16, commands and data including parameters necessary for the image construction.

An image display unit 18 is connected to the console panel 17 for displaying the generated slice images and other data.

The RF coil 4 irradiates RF pulses which are generated at the transmitter 7, and the RF pulses are transmitted via the transmit/receive switch 6 and the matching device 5. The MR signals from the sample 1 are received by the RF coil 4 and transmitted via the matching device 5 and the transmit/receive switch 6 to the receive 8.

The operation of the prior art MR imaging method will now be described with reference to the pulse sequence chart of FIG. 2. In this method, the gradient field echo method is used in combination with the two-dimensional Fourier transformation (2DFT) method. The magnetic field in the direction of the Z-axis (generated by the Z-axis magnetic field coil 13) is the slicing magnetic field Gs for designating the slice plane. The magnetic field in the direction of the X-axis (generated by the X-axis gradient magnetic field coil 9) is the signal reading magnetic field Gr for collecting signals. The magnetic field in the direction of the Y-axis (generated by the Y-axis gradient magnetic field coil 11) is the phase encoding magnetic field Ge. Moreover, the RF magnetic field pulse RF is a $\alpha^o$ ($\alpha \leq 90$) pulse.

First, a sample 1 is inserted in the static magnetic field generator 2, the RF coil 4, and the gradient magnetic field coils 9, 11 and 13. Then the RF coil 4 and the Z-axis gradient magnetic field 13 are driven by the sequence controller 15 to apply an RF magnetic field pulse RF having a selected frequency. At the same time, a slice magnetic field Gs1 for designating the slice plane is applied to the sample 1. As a result, energy is imparted to the nuclear spins in the desired slice plane within the sample. The RF magnetic field pulse RF assumes its peak value when the pulse area of the slice magnetic field Gs1 becomes ½ (of its full area).

Then, a slice magnetic field Gs2 having an opposite polarity and having a pulse area (hatched) equal to ½ of the slice magnetic field Gs1 (i.e., the area B2 shown by hatching is equal to the area B1 also shown by hatching) is applied to rephase the magnetic spins (in the direction of the slice i.e., the Z-axis). At the same time, Y-axis gradient magnetic field coil 11 and the X-axis gradient magnetic-field coil 9 are driven to apply the phase encoding magnetic field Ge and the signal reading magnetic field Gr1 for the time T. The reading magnetic field Gr1 is applied for dephasing the MR signals in the direction of the X-axis. By the application of the signal reading magnetic field Gr1, the MR signal R is phase-disordered.

Subsequently, while a signal reading magnetic field Gr2 having an opposite polarity is applied, the MR signal R due to the gradient magnetic field echo is received by the RF coil 4, and supplied to the computer 16. The MR signal R which has been dephased is then rephased gradually by the application of the signal reading magnetic field Gr2, and thereafter dephased again. The time-point at which the MR signal R assumes its peak is dependent on the time-points at which the RF magnetic field pulse and the signal reading magnetic field are applied, and is dependent upon expiration of the echo time TE after the peak of the RF magnetic field pulse, and when the hatched pulse area of the signal reading magnetic field Gr2 equal the pulse area of the signal reading magnetic field Gr1.

The MR signals R are collected at predetermined sampling points for the period (t+t') of application of the signal reading magnetic field Gr2.

The above sequence has a repetition period TR corresponding to the image contrast. The above sequence is repeated the number of times corresponding to the predetermined number of pixels N, with the pulse of the phase encoding magnetic field Ge having its area (or, in the embodiment illustrated, the intensity if the pulse width is fixed) varied as indicated by the broken lines, and a plurality of MR signals R are sampled and received as a series of pulses. As a result, resolution of the MR signals R in the Y-axis can be made. For instance, if the number of pixels is 256×256, the number of samples received in one cycle is not less than 256 and the number of repetitions (signal collections) will be 256.

The computer 16 performs the two-dimensional Fourier transformation on the MR signals to reconstruct the images of the slice planes having a desired matrix size of N×N. The reconstructed image is displayed on the display unit 18.

On the assumption that the MR signals R are received from a stationary part and a moving part in the sample 1, and the time of commencement of the application of the signal reading magnetic field Gr1 is assumed to be $t=0$, the phase deviations $\phi_0$ and $\phi_1$ of the MR signals R from the stationary part and the moving part at the time $t=2T$ will be considered.

If $-P$ and $P$ represent the intensities of the signal reading magnetic fields Gr1 and Gr2, r the gyromagnetic ratio, and $X_0$ the coordinate of the stationary part, the phase deviation $\phi_0$ of the stationary part during $t=0$ to $2T$ is given by the sum of the integral of the signal reading magnetic field Gr1 over $t=0$ to $T$:

$$\int_0^T r(-P) X_0 \, dt$$

and the integral of the signal reading magnetic field Gr2 over time $t=T$ to $2T$:

$$\int_T^{2T} r P X_0 \, dt$$

That is $$\phi_0 = \int_0^T r(-P) X_0 \, dt + \int_T^{2T} r P X_0 \, dt \quad (A1)$$
$$= r P X_0 [-T + (2T - T)]$$
$$= 0$$

This means that the phase deviation $\phi_0$ of the MR signals R from the stationary part becomes zero at $t=2T$, and the disorder of the phase is eliminated.

On the other hand, if the coordinate of the moving part such as blood flow which moves at a constant velocity v is represented by $(X_1+vt)$, the phase deviation $\phi_1$ is given by:

$$\phi_1 = \int r(-P)(X_1 + vt) \, dt + \int r P (X_1 + vt) \, dt \quad (A2)$$
$$= r P X_1 [-T + T] + r P v \{-(T^2/2) + [(4 T^2/2) - (T^2/2)]\}$$
$$= r P_V T^2$$
$$\neq 0$$

Thus, at $t=2T$, the phase deviation $\phi_1$ of the MR signals R from the moving part does not become zero, and the rephasing is not achieved.

As described above, in the prior-art MR imaging method, the polarity of the signal reading magnetic field Gr is reversed once to obtain the MR signals R. As a result, the phase deviation $\phi_1$ of the moving part of the sample 1 does not become zero and rephasing is not achieved. Accordingly, artifacts occur and degrade the quality of the image.

Another example of prior-art system and a problem associated therewith will now be described with reference to FIG. 3. This prior art system is an example using the spin echo method. It is assumed that the RF pulse A1 is a 90° pulse, the RF pulse A2 is a 180° pulse, the NMR signal B is a spin echo signal, the X-axis gradient magnetic field Gr is a signal reading magnetic field for frequency encoding, the Y-axis gradient magnetic field Ge is a phase encoding magnetic field, and the Z-axis gradient magnetic field Gs is the slice magnetic field for designating the slice plane. It is also assumed that the NMR signals B are used for constructing an image by the two-dimensional Fourier transformation method.

First, a sample 1 is inserted in a static magnetic field generating unit 2, an RF coil 4, gradient magnetic field coils 9, 11 and 13, and the RF coil 4 and the Z-axis gradient magnetic field coils 13 are driven to simultaneously apply the RF pulse A1 and the slice magnetic field Gs1 to the sample 1. As a result, energy is supplied to the nuclear spins within the desired slice plane in the sample 1, and the phases of the nuclear spins begin to be disordered starting with the central position (peak time-point) of the RF pulse A1.

Next, the X-axis gradient magnetic field coil 9 and the Y-axis gradient magnetic field coil 11 are driven to apply the signal reading magnetic field Gr1 and the phase encoding magnetic field Ge, and to again apply the RF pulse A2 and the slice magnetic field Gs2. To align the spins in the direction of the slice (Z-axis) at the time of application of the slice magnetic field Gs1, the central position of the slice magnetic field Gs2 is shifted relative to the central position of the RF pulse A2.

After that, the NMR signal B is received while a signal reading magnetic field Gr2 having the same polarity as Gr1 is applied, and the NMR signal B is read in the computer 16. After the pulse area of the signal reading magnetic field Gr2 becomes equal to the pulse area of Gr1, i.e., upon expiration of the echo time TE from the central position of the RF pulse A1, the NMR signal B assumes its central position (peak value). Accordingly, the time-point at which the NMR signal B assumes its peak value is dependent on the time-points at which the RF pulse A1 and the signal reading magnetic field Gr2 are applied. The data of the NMR signal B are collected at a predetermined number of sample points while the signal reading magnetic field Gr2 is applied.

The above sequence is repeated a predetermined number of times corresponding to the predetermined number N (e.g., 256) of pixels while the phase encoding amount Ki determined from the pulse area of the phase encoding magnetic field Ge is varied at a predetermined pitch (see the broken lines). For example, when the number of pixels of the slice image is N×N, the number of the samples for the NMR signal B in a single cycle is not less than N, and the computer 16 performs two-dimensional Fourier transformation on the pulse series of the NMR signals B to reconstruct the slice image of the matrix size of N×N. This slice image is then displayed on the display unit 18.

In the above example, the signal reading magnetic field Gr1 is applied between the RF pulses A1 and A2. But it may alternatively be applied immediately before the signal reading magnetic field Gr2 with a reverse polarity. Moreover, a slice magnetic field Gs2 having its central position coinciding with the RF pulse A2 to align the spins in the direction of the slice may be applied immediately after the slice magnetic field Gs1 with a reverse polarity.

Now another prior-art method will be described with reference to FIG. 4 and FIG. 1.

FIG. 4 shows waveforms produced by means of the program of the computer 16 shown in FIG. 1 and output from the sequence controller 15. It is assumed that the two-dimensional Fourier transformation method is used in combination with the spin echo method.

First, a sample 1 is inserted in a static magnetic field generating device 2, an RF coil 4, gradient magnetic field coils 9, 11 and 13, and the RF coil 4 and the Z-axis gradient magnetic field coil 13 are driven simultaneously to apply an RF magnetic field pulse having a selected frequency (usually a 90° pulse) RF1 and a slice magnetic field Gs1 for designating the slice plane. Energy is thereby supplied to the nuclear spins within the desired slice plane in the sample 1. The slice magnetic field Gs4 is applied so that the total area of Gs after the peak of RF1 is zero thereby to align the phase of the spins in the direction of the slice.

Then, the Y-axis gradient magnetic field coil 11 is driven to apply the phase encoding magnetic field Ge1.

Thereafter, a 180° pulse is applied and then the X-axis gradient magnetic field coil 10 is driven so that, while the magnetic fields Gr8 and Gr10 are applied, an MR signal due to the spin echo is derived when the area of Gr10 becomes equal to the area of Gr8, i.e., TE after the peak of RF1. The MR signal is input to the computer 16 via the RF coil 4.

The time-point at which the MR signal assumes its peak is dependent on the time-point of the signal reading magnetic field and the RF magnetic field. The peak of 180° pulse RF2 is made to appear at ½ between the peak of S1 and the peak of RF1.

The above-described MR imaging system is programmed to collect and image the signals of the stationary spins. Where there are moving spins, uncontrolled phase deviation and the introduction of spins from outside of the slice plan, artifacts may occur. Moreover, it is not possible to image the velocity, the flow velocity, the acceleration, the jerk, etc.

Another problem associated with the prior-art MR imaging method is that it does not take account of the movement of the sample, such as body movement of a patient, so that the resultant slice image contains artifacts.

SUMMARY OF THE INVENTION

An object of the present invention is to reduce the artifacts even when the MR signals are extracted from the stationary part and the moving part in the sample.

Another object of the present invention is to reduce the artifacts even when the sample moves.

According to a first aspect of the invention, there is provided a method of NMR or ESR, or the like imaging in which an RF magnetic field pulse, a slice magnetic field, a phase encoding magnetic field and a signal reading magnetic field are applied to a sample in a predetermined sequence, and constructing a desired slice image on the basis of a magnetic resonance signal from the sample, comprising the steps of:

applying a first signal reading magnetic field having a predetermined pulse area;

applying a second signal reading magnetic field having said predetermined pulse area and having a polarity opposite to that of said first signal reading magnetic field; and applying a third signal reading magnetic field having the same polarity as that of said first signal reading magnetic field;

wherein said steps of applying the first signal reading magnetic field, applying the second signal reading magnetic field and applying the third signal reading magnetic field are performed in the interval from the application of the RF magnetic field pulse and until a magnetic resonance signal is obtained; and the peak value of the magnetic resonance signal is obtained when the pulse area of the third signal reading magnetic field becomes equal to said predetermined pulse area.

In this aspect of the invention, the first and second signal reading magnetic fields having the pulse area ratio of 1:2 and having opposite polarities to each other are used for dephasing, and then a third signal reading magnetic field is used for rephasing so that the phase deviations of the MR signals from the stationary part and the moving part are eliminated at the time when the MR signal assumes the peak value.

According to another aspect of the invention, there is provided a method of magnetic resonance imaging for constructing a desired slice image on the basis of magnetic resonance signals, said method comprising the step of:

repeating the sequence comprising applying an RF magnetic field pulse, a slice magnetic field, a phase encoding magnetic field and a signal reading magnetic field, and collecting the magnetic resonance signals from the sample, varying the phase encoding coefficients in accordance with the body movement of the sample, said encode coefficients determining the phase encoding amounts, applying the predetermined phase encoding amounts to the imaging region of the sample, whereby the relative position of the imaging region is maintained.

In this aspect of the invention, responsive to the body movement of the sample, when the end region is enlarged, the phase encode coefficients are reduced, and when the end region is reduced the phase encode coefficients are increased, so that the field of view (FOB) is changed to maintain constant the relative position (phase) of the imaging region.

According to another aspect of the invention, there is provided a method of magnetic resonance imaging comprising the steps of:

repeating the sequence including applying an RF pulse, a slice magnetic field, a signal reading magnetic field and a phase encoding magnetic field to a sample, and collecting NMR signals from the sample;

with the phase encoding amount Ki due to the phase encoding magnetic field being varied responsive to the order of the signal collection i, and a slice image being constructed from the NMR signals that have been collected;

wherein at least one of the slice magnetic field Gs(t) applied in accordance with the RF pulse, the signal reading magnetic field Gr(t) applied in accordance with the NMR signal, and the phase encoding magnetic field Ge(t) is divided into a plurality of pulses; and the areas of the pulses with the polarity being considered are set as to satisfy, with respect to the slice magnetic field Gs(t), the relationship on the integral from the central position of the RF pulse, $$\int rGs(t)Ps(t)dt=0;$$

satisfy, with respect to the signal reading magnetic field Gr(t), the relationship on the integral to the central position of the NMR signals, $$\int rGr(t)Pr(t)dt=0$$

and satisfy, with respect to the phase encoding magnetic field Ge(t), the relationship on the integral $$\int rGe(t)Pe(t)dt=Ki;$$

where r represents the gyromagnetic ratio, and Ps(t), Pr(t) and Pe(t) represent the components of the position of the object nucleus in the directions of the respective gradient magnetic fields.

In this aspect of the invention, even if the sample moves during the period of from when the RF pulse is applied until the NMR signal is collected, the disorder of the phase of the spins is corrected by the plurality of pulses, and the phase disorder of the NMR signal that is received can be prevented.

According to another aspect of the invention, there is provided a method of magnetic resonance imaging in which the magnetic resonance is utilized, comprising imaging the time derivative of the position of the object spins which move.

In this aspect of the invention, the gradient magnetic field which gives the phase deviation proportional to the time derivative of the position of the object spins to the object spins, so that the time derivative of the position can be determined from the phase deviation giving the time derivative of the position.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus, are not limitative of the present invention, and wherein:

FIG. 11 is a diagram showing phase encode coefficients used in an example of the prior art MR imaging method.

FIG. 13 is a diagram showing phase encode coefficients used in an embodiment of the invention.

DETAILED DESCRIPTION OF THE EMBODIMENTS

Figure 5:
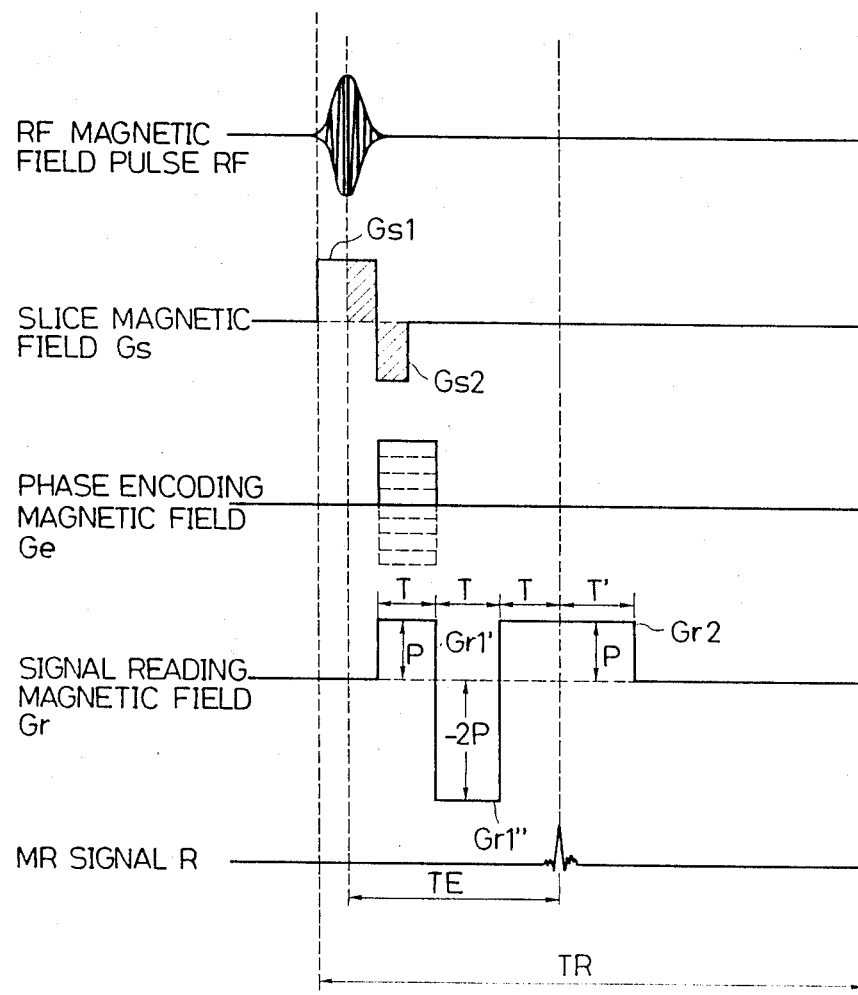
FIG. 5 is a pulse sequence diagram showing the operation of an embodiment of the MR imaging method according to the invention.

An embodiment of the invention will now be described with reference to the pulse sequence diagram of FIG. 5. The imaging method of this embodiment can applied to the MR imaging system shown in FIG. 1. For implementing the method of the invention, it is only necessary to change the program and the calculated data in the computer 16. In FIG. 5, the signal reading magnetic field Gr differs from the prior art of FIG. 2 in that the echo time TE and the repetition period TR are made a little longer. In other respects, the pulse sequence is identical to that of the prior art of FIG. 2. It is noted that the pulses are shown to be rectangular, rather than trapezoidal, but this is for the purpose of simplicity of illustration and description of the concept of the invention.

During the time interval from the application of the RF pulse RF until appearance of the peak value of the MR signals R, a first signal reading magnetic field Gr1' having the duration T and the intensity P, and hence a predetermined pulse area (T×P) is first applied, and then a second signal reading magnetic field Gr1'' having the time T and the intensity (−2P), and hence the pulse area (T×2P) twice the predetermined pulse area and having the polarity opposite to the first signal reading magnetic field Gr1' is applied. Because of these first and second signal reading magnetic fields Gr1' and Gr1'', the MR signals R are dephased (phase-disordered) in the direction of the signal reading magnetic field (X-axis).

Then, a third signal reading magnetic field Gr2 having the same intensity P and having the same polarity as the first signal reading magnetic field Gr1' is applied and when the pulse area of the third signal reading magnetic field Gr2 becomes equal to the predetermined pulse area (T×P), the phase deviation is eliminated (i.e., rephasing is achieved) to obtain the peak value of the MR signals R.

Figure 1:
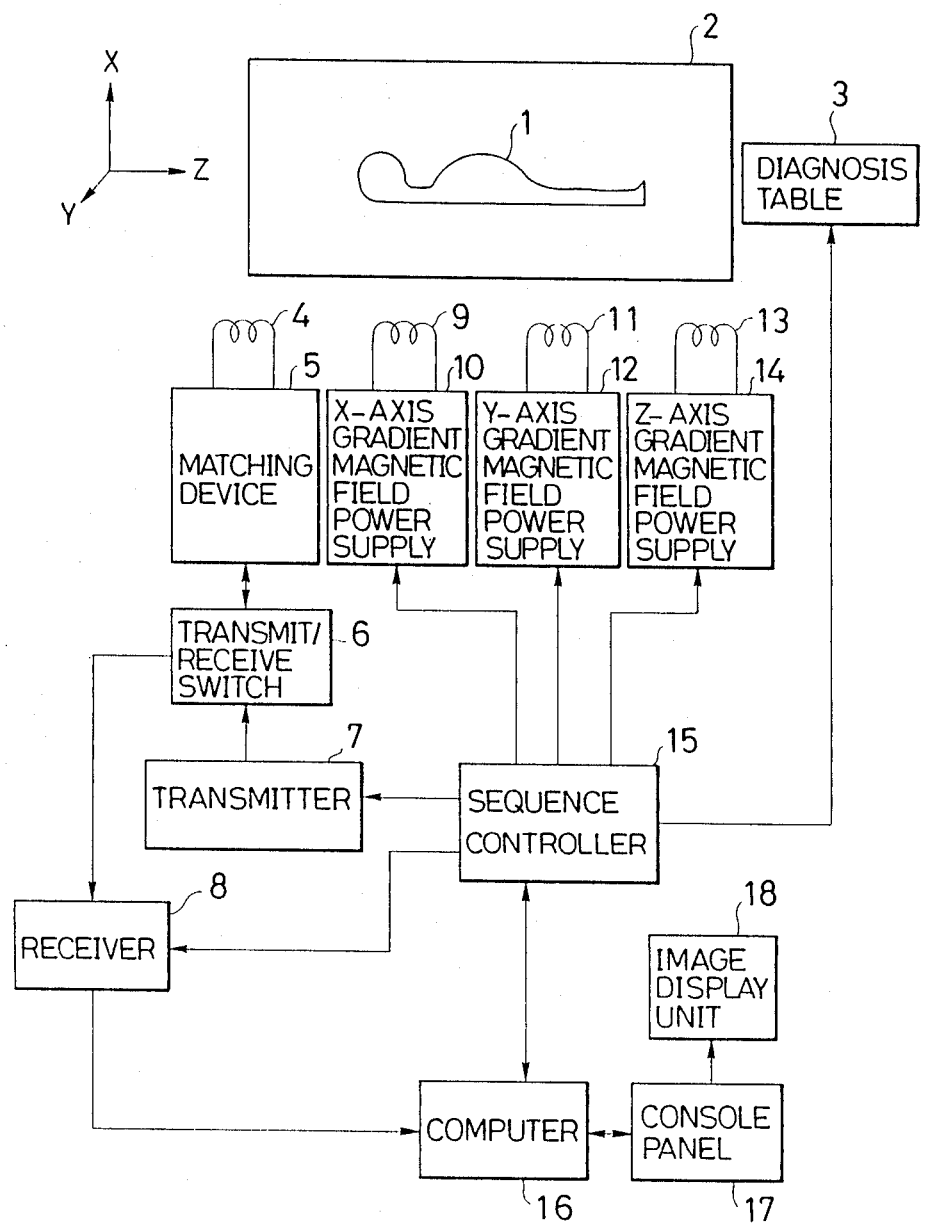
FIG. 1 is a block diagram showing a typical magnetic resonance (MR) imaging system.

Let us now assume that MR signals R are received from a stationary part and a moving part in the same sample 1 as in the above description (see FIG. 1). Let us consider the phase deviations $\phi_0$ and $\phi_1$ of the MR signals R from the stationary part and the moving part at $t=3T$, with the time-point at which the application of the signal reading magnetic field Gr1' is commenced being defined at $t=0$.

In the same way as the equation (A1) above, the phase deviation $\phi_0$ of the stationary part at $t=0$ to $3T$ can be given by the sum of: the integral of the first signal reading magnetic field Gr1' over $t=0$ to T, i.e., $$\phi_{01} = \int_{t=0}^{T} rPX_0\, dt;$$

the integral of the second signal reading magnetic field Gr1'' over $t=T$ to $2T$, i.e., $$\phi_{02} = \int_{t=T}^{2T} r(-2P)X_0\, dt;$$

and the integral of the third signal reading magnetic field Gr2 over $t=2T$ to $3T$, i.e., $$\phi_{03} = \int_{t=2T}^{3T} rPX_0\, dt.$$

That is, the sum is given by:

$$\begin{aligned}\phi_0 &= \phi_{01} + \phi_{02} + \phi_{03} \\ &= rPX_0[T - 2(2T-T) + (3T-2T)] \\ &= 0\end{aligned} \quad (A3)$$

Thus, the phase deviation of the MR signal R from the stationary part is zero at $t=3T$, and the phase deviation is eliminated.

The phase deviation $\phi_1$ of the moving part is given by an equation identical to the equation (A3) with the exception of the substitution of $(X_1+vt)$ for $X_0$. That is, it is given by the sum of the first signal reading magnetic field Gr1' over $t=0$ to T, i.e., $$\phi_{11} = \int_{t=0}^{T} rP(X_1+vt)\, dt;$$

the integral of the second signal reading magnetic field Gr1'' over $t=T$ to $2T$, i.e., $$\phi_{12} = \int_{t=T}^{2T} r(-2P)(X_1+vt)\, dt;$$

and the integral of the third signal reading magnetic field Gr2 over $t=2T$ to $3T$, i.e., $$\phi_{13} = \int_{t=2T}^{3T} rP(X_1+vt)\, dt.$$

That is, $$\begin{aligned}\phi_1 &= \phi_{11} + \phi_{12} + \phi_{13} \\ &= rPX_1[T - 2(2T-T) + (3T-2T)] + \\ &\quad rPv\{T^2/2 - 2[(4T^2/2)-(T^2/2)] + \\ &\quad [(9T^2/2)-(4T^2/2)]\} \\ &= rPv[(T^2/2) - 3T^2 + (5T^2/2)] \\ &= 0\end{aligned} \quad (A4)$$

Thus, the phase deviation $\phi_1$ of the MR signals R is also zero at $t=3T$.

In this way, by using the first, second and third signal reading magnetic fields Gr1', Gr1'' and Gr2, having the pulse area ratios of 1:2:1 and having alternately opposite polarities, the phase deviations $\phi_0$ and $\phi_1$ at the time when the MR signals R assume their peak will be zero so that the phase deviation is completely eliminated.

Figure 6:
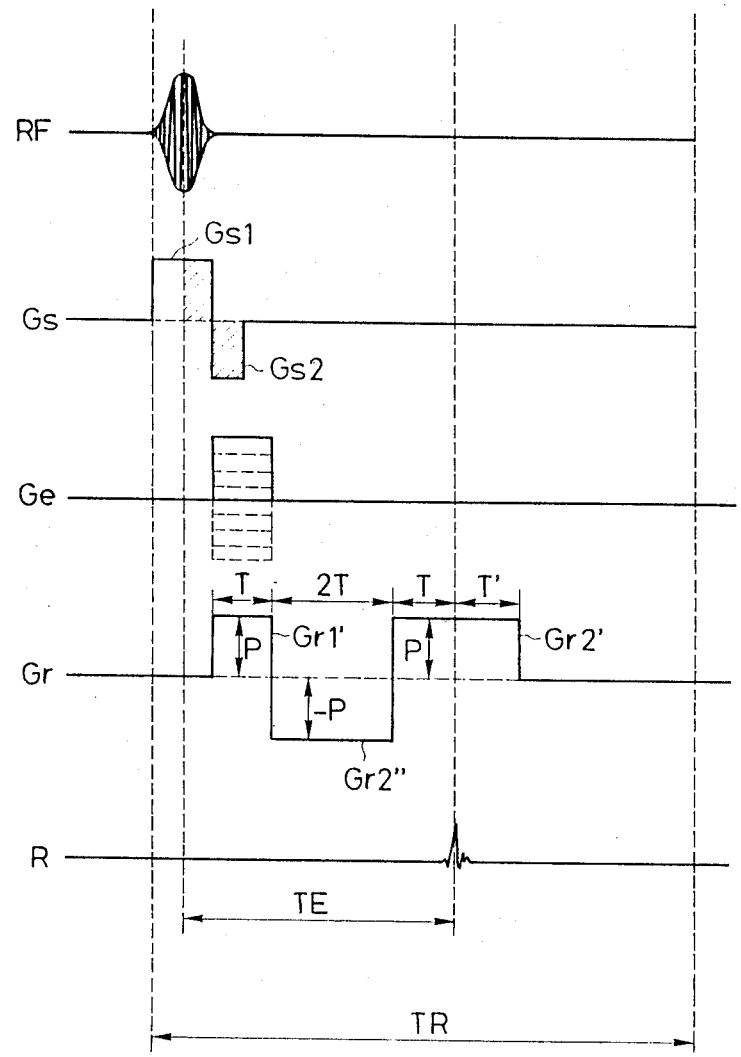
FIG. 6 is a pulse sequence diagram showing the operation of another embodiment of the MR imaging method according to the invention.

In the above embodiment, in order that the pulse area of the signal reading magnetic field Gr1'' be twice that of the first signal reading magnetic field Gr1', the absolute value of the intensity of the second signal reading magnetic field Gr1'' is set to be twice that of the first signal reading magnetic field Gr1'. Alternatively, the width (duration of application) of the second signal reading magnetic field Gr1'' may be made twice that of the first signal reading magnetic field Gr1', as shown in FIG. 6.

In this case, the peak value of the MR signal R is obtained at $t=4T$, and the phase deviations $\phi_{02}$ and $\phi_{12}$ of the second signal reading magnetic field Gr1'' are given by the integral over $t=T$ to $3T$, i.e., $$\phi_{02} = \int_{t=T}^{3T} r(-P)X_0\, dt$$

$$\phi_{12} = \int_{t=T}^{3T} r(-P)(X_1 + vt)\, dt$$

The phase deviations $\phi_{03}$ and $\phi_{13}$ related to the third signal reading magnetic field Gr2 are given by the integral over $t=3T$ to $4T$, i.e., $$\phi_{03} = \int_{t=3T}^{4T} r P X_0\, dt$$

$$\phi_{13} = \int_{t=3T}^{4T} r P (X_1 + vt)\, dt$$

If these integrals are substituted in the equations (A3) and (A4), $$\phi_0 = \phi_{01} + \phi_{02} + \phi_{03} \tag{A5}$$
$$= r P X_0 [T - (3T - T) + (4T - 3T)]$$
$$= 0$$

$$\phi_1 = \phi_{11} + \phi_{12} + \phi_{13} \tag{A6}$$
$$= r P X_1 [T - (3T - T) + (4T - 3T)] +$$
$$r P_V \{T^2/2 - [(9T^2/2) - (T^2/2)] +$$
$$[(16T^2/2) - (9T^2/2)]\}$$
$$= r P_V [(T^2/2) - 4T^2 + (7T^2/2)]$$
$$= 0$$

Thus, the phase deviations $\phi_0$ and $\phi_1$ of the MR signals from the stationary part and the moving part become zero at $t=4T$.

In the embodiments of FIG. 5 and FIG. 6, the disorder of the phase after the extraction of the MR signals is not corrected. However, as shown in FIG. 7 and FIG. 8, or FIG. 9 and FIG. 10, after the MR signal R is obtained, a phase encoding magnetic field Ge' of the opposite polarity may be applied to correct the phase disorder in the phase encoding magnetic field (Y-axis) direction. Moreover, a signal reading magnetic field Gr3 or Gr3' and Gr3" may be applied to correct the disorder of the phase in the signal reading magnetic field (X-axis) direction.

Figure 7:
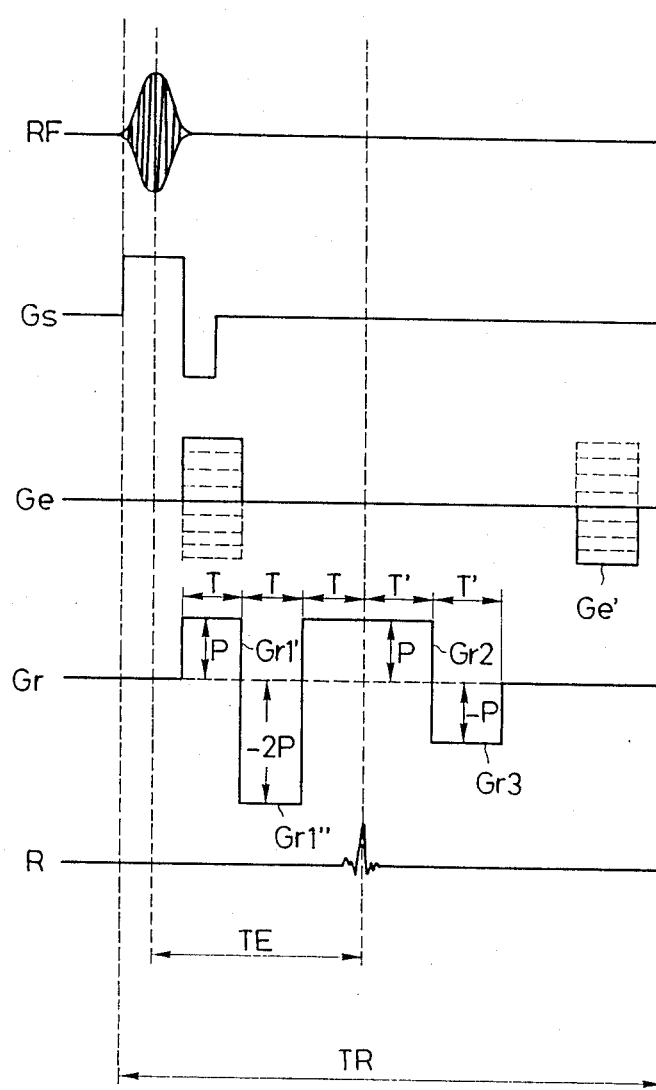
FIG. 7 is a pulse sequence diagram showing the operation of another embodiment of the MR imaging method according to the invention.
Figure 8:
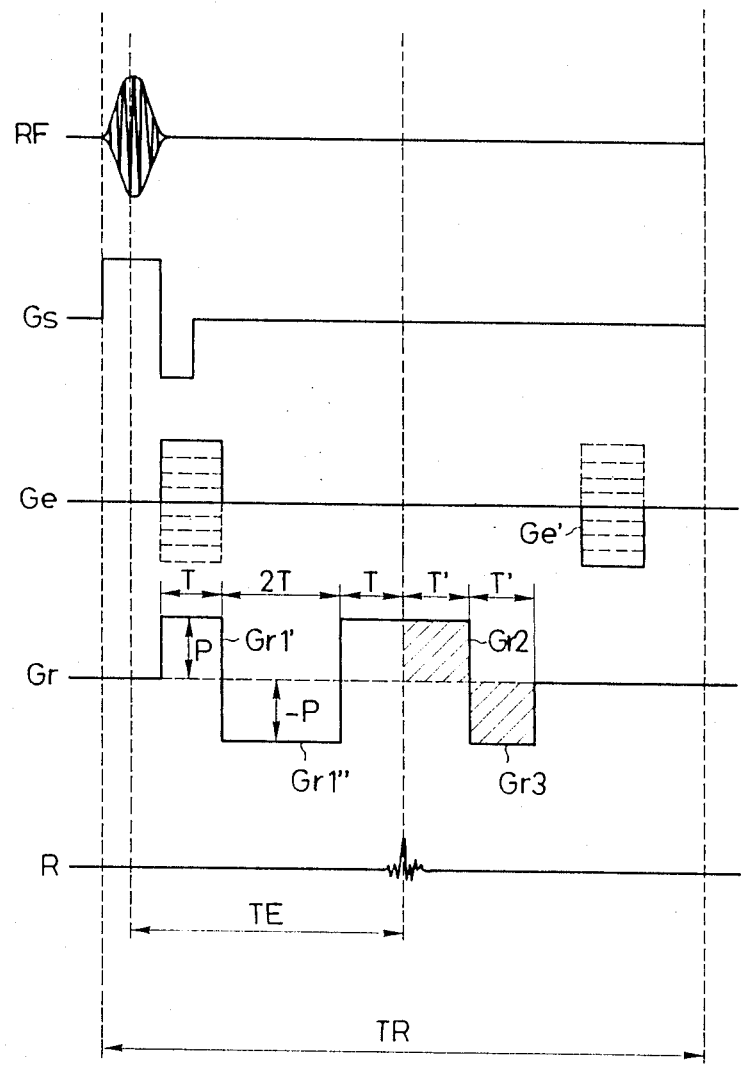
FIG. 8 is a pulse sequence diagram showing the operation of another embodiment of the MR imaging method according to the invention.
Figure 9:
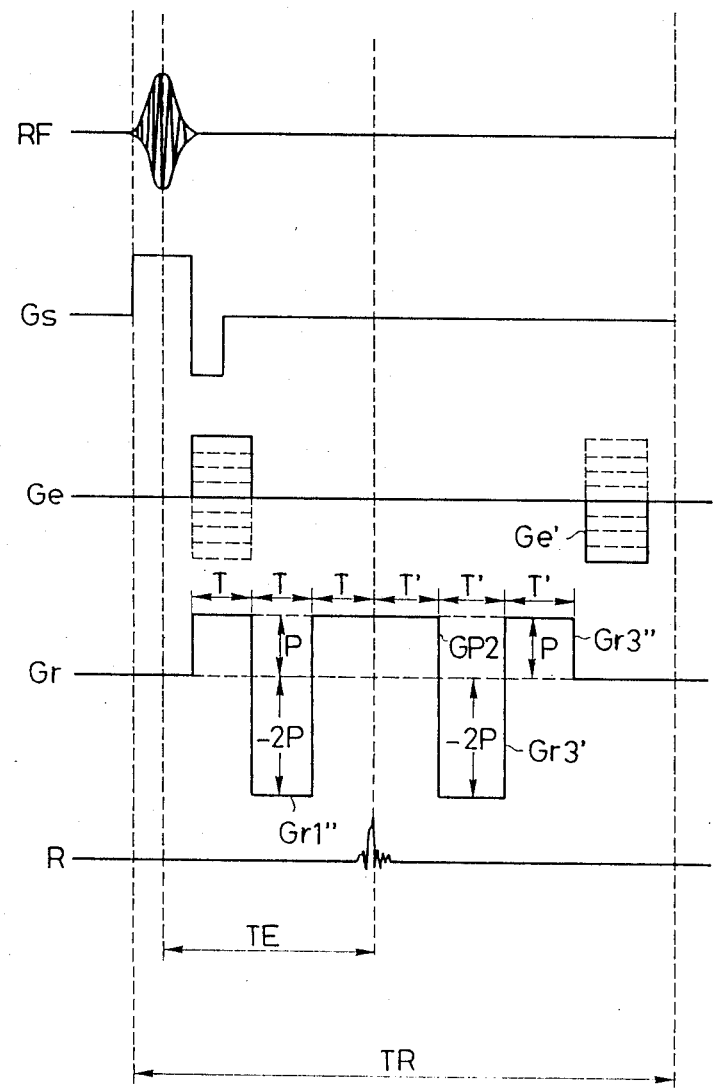
FIG. 9 is a pulse sequence diagram showing the operation of another embodiment of the MR imaging method according to the invention.
Figure 10:
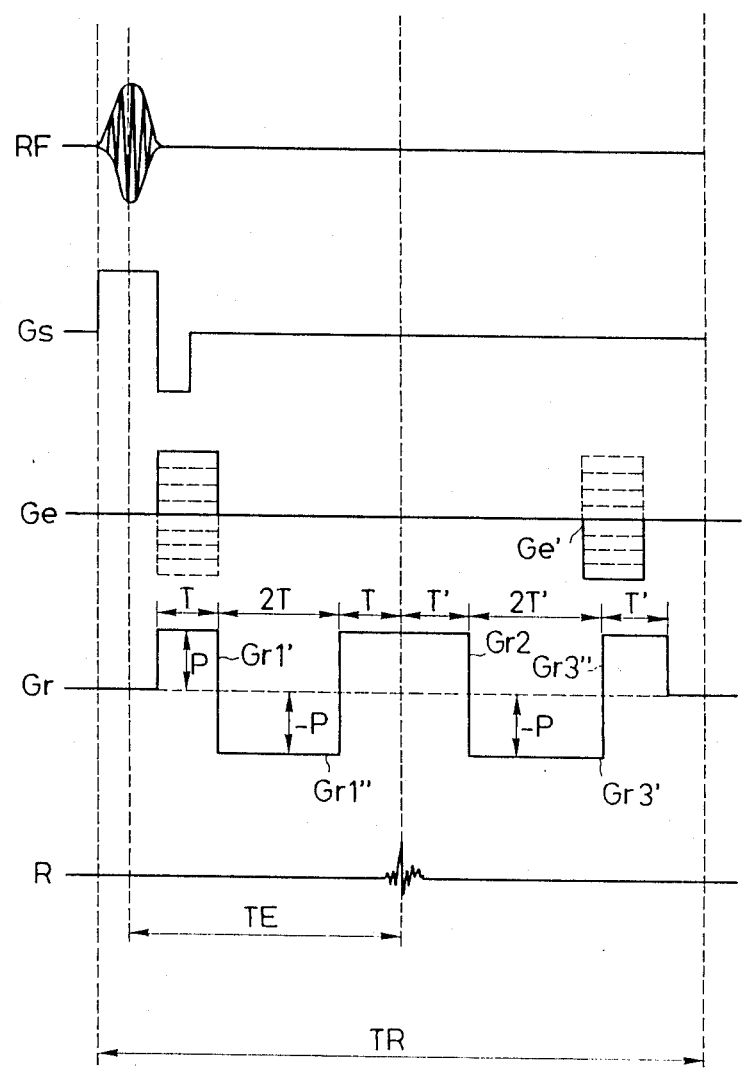
FIG. 10 is a pulse sequence diagram showing the operation of another embodiment of the MR imaging method according to the invention.

In FIG. 7 and FIG. 8, by the signal reading magnetic field Gr3 having the polarity opposite to that of the signal reading magnetic field Gr2 and having the pulse area (T'×P), the phase disorder in the direction of the signal reading magnetic field concerning the stationary part is corrected. In FIG. 9 and FIG. 10, by the signal reading magnetic field Gr3' having the polarity opposite to that of Gr2 and having the pulse area of 2(T'×P) and the signal reading magnetic field Gr3" having the same polarity as Gr2 and having the pulse area (T'×P), the phase disorder in the direction of the signal reading magnetic field concerning the stationary part and the moving part is corrected.

Moreover, in FIG. 9 and FIG. 10, the waveform of the signal reading magnetic fields Gr3' and Gr3" is almost a mirror image of the waveform up to the echo time TE. But the waveform after TE in FIG. 10 may be used in substitution for the waveform after TE in FIG. 9. Similarly, the waveform after TE in FIG. 9 may be used in substitution for the waveform after TE in FIG. 10. Furthermore, the duration of application of the correction phase encoding magnetic field Ge' can be made coincident with the duration of application of the signal reading magnetic field Gr3", so that the echo time can be shortened. In either case, regardless of the presence or absence of the phase encoding magnetic field Ge', the phase deviation in the direction of the signal reading magnetic field can be maintained at zero.

Moreover, in order to correct the phase disorder in the direction of the slice magnetic field (Z-axis), a slice magnetic field (not shown) similar to the slice magnetic field Gs2 may be applied before the slice magnetic field Gs1.

In the above description, it was assumed that the 2DFT method is used. But the invention is applicable to the 3DFT method. Moreover, as the MR signals, gradient magnetic field echo signals are derived. But spin echo signals may alternatively be obtained.

As has been described, according to the above embodiments, the phase deviations of the MR signals from the stationary part and the moving part can be made zero, so that at the time of collecting the MR signals, disorder of the phase of the spins due to the moving part moving at a constant velocity is prevented. Accordingly, the artifacts due to the moving part are restrained and an image with a high quality can be obtained.

Another embodiment of the invention will now be described with reference to FIG. 11 through FIG. 13. First a problem to which this embodiment is addressed will be described.

In the sequence of collecting signals, the phase encoding coefficients K which determine the phase encoding amount E at the end region of the sample 1 (i.e., in the direction of the Y-axis) vary with the order in which the signals are collected, as shown in FIG. 11. The phase encoding coefficients K represent the ratio of the i-th phase encoding amount Ei to the first phase encoding amount E1.

The amplitude of the i-th phase encoding magnetic field Gei(t) is so set that the phase encoding amount Ei is given by:

$$Ei = \int r L Gei(t)\, dt = 2n\pi \tag{B1}$$

Here, $$n = (N/2) + 1 - i \tag{B2}$$

$$i = 1, 2, \ldots, N$$

where r represents the gyromagnetic ratio of the object nuclei,

L represents the field of view in the direction of the phase encoding (Y-axis), and t represents the time after the commencement of the imaging.

The integral of the equation (B1) is performed over the time in which the phase encoding magnetic field Gei(t) is applied.

Figure 2:
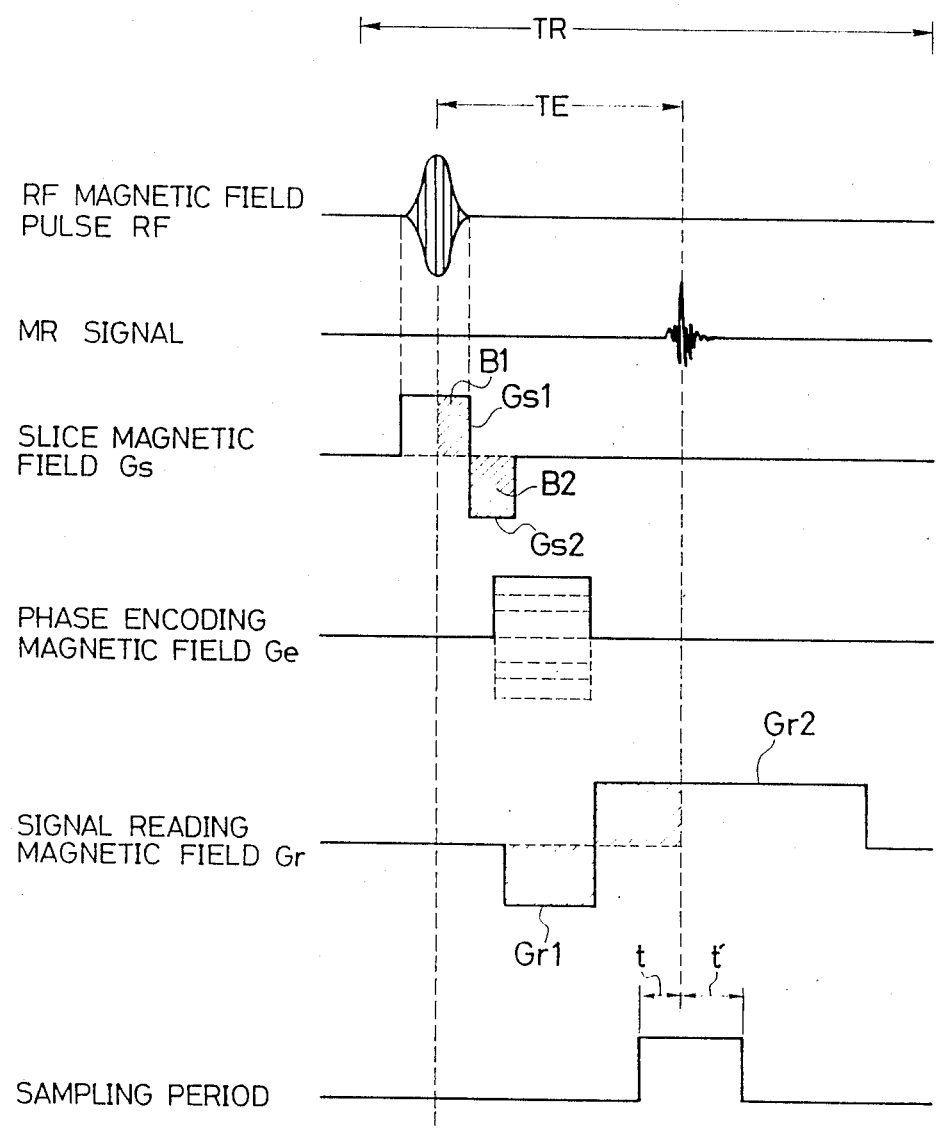
FIG. 2 is a pulse sequence diagram showing the operation of an example of the prior art MR imaging method.

The amplitude of the i-th phase encoding magnetic field Gei(t) is varied for each signal collection, as indicated by broken lines in FIG. 2. Moreover, the amplitude of the first phase encoding magnetic field Ge1(t) is so set that, from the equations (B1) and (B2), the phase encoding amount E1 is given by:

$$E1 = \int rL\, Ge1(t)\, dt \qquad (B3)$$
$$= 2(N/2)\pi$$

Accordingly, from the equations (B1) and (B3), the amplitude ratio between the phase encoding magnetic field Gei(t) and Ge1(t), i.e., the i-th phase encoding coefficient Ki is given by:

$$\begin{aligned} Ki &= \int rL\, Gei(t)\, dt / rL\, Ge1(t) \qquad (B4)\\ &= \int Gei(t)\, dt / \int Ge1(t)\, dt \\ &= 2[(N/2)+1-i]\pi/2(N/2)\pi \\ &= [(N/2)+1-i]/(N/2) \end{aligned}$$

The equation (B4) will give the phase encoding coefficients shown in FIG. 11.

Figure 12:
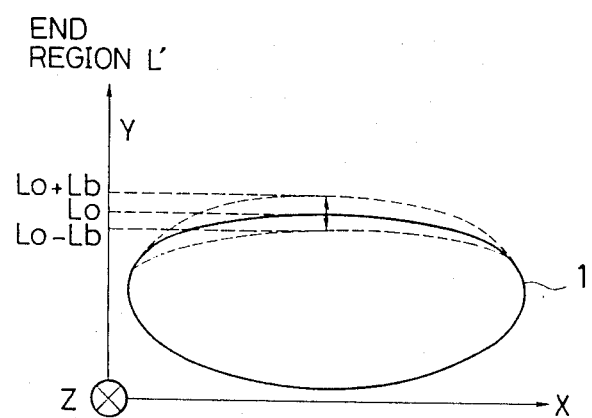
FIG. 12 is a diagram showing the body movement of the sample.

In practice, however, the sample 1 may move in the direction of the phase encoding (Y-axis) due to breathing or the like as shown in FIG. 12. As a result, the end region L' moves up and down about the average position $L_0$ with an amplitude Lb, and the actual field of view L moves over the range $(L_0-Lb)$ to $(L_0+Lb)$. The phase encoding coefficients K are fixed, assuming that the sample 1 is stationary, and the field of view L equals $L_0$.

However, because of movement of the imaging region of the sample 1 which moves due to body movement, it is not possible to apply a predetermined phase encoding amount E and the resultant slice image contains artifacts, which degrade the image quality, with the result that diagnosis is difficult.

The embodiment which will next be described is addressed to the problem discussed above, and its object is to reduce artifacts even when the sample moves.

This embodiment of the invention will now be described with reference to FIG. 1, FIG. 2 and FIG. 12. The MR system and the pulse sequence that can be used for the implementation of this embodiment is identical to those shown in FIG. 1 and FIG. 2. It is only necessary to change the program for the arithmetic operation in the computer 16 or the sequence controller 15.

Let the body movement period of the sample 1 be Tb, as illustrated in FIG. 12, and the index indicating the movement (absolute position) of the sample 1 at the commencement of the imaging, t=0, be $t_0$, then the position L' of the end region of the sample 1 will be given by:

$$L' = L_0 + Lb\cdot f(t, t_0, Tb) \qquad (B5)$$

Thus, it is expressed as a periodic function $f(t, t_0, Tb)$. The periodic function $f(t, t_0, Tb)$ is calculated by the computer 16 (FIG. 1) on the basis of the signals from a body movement sensor such as a breathing sensor, not illustrated. Another example of the breathing sensor that can be used is a belt-type sensor wound on the abdominal region of the patient. Moreover, when the periodic function $f(t, t_0, Tb)$ cannot be expressed by an arithmetic equation, the values of the function for a full period can be stored in a table in the computer 16 or the sequence controller 15.

If the intensity of the phase encoding magnetic field Ge that should be applied at the i-th cycle is represented by: Gei'(t), the phase encoding amount Ei' will be:

$$Ei' = \int rL'\, Gei'(t)\, dt$$

Substituting the equation (B5) for L'

$$Ei' = \int r[L_0 + Lb\cdot f(t, t_0, Tb)] Gei'(t)\, dt \qquad (B6)$$

It will be seen that the phase encoding amount varies with the value of $Lb\cdot f(t, t_0, Tb)$.

The time (several milli-seconds) for which the phase encoding magnetic field Ge is applied is sufficiently short compared with the body movement period (several seconds) due to the breathing. Accordingly, the value of $Lb\cdot f(t, t_0, Tb)$ during one cycle of signal collection can be regarded as unchanged. If a time interval corresponding to the repetition period TR (about 0.5 seconds) of the signal collection, the i-th signal collection time t will be $$\begin{aligned} t &= t' \qquad (B7)\\ &= (i-1)TR \end{aligned}$$

If this value t' is used, the equation (B5) will be:

$$L' = L_0 + Lb\cdot f(t', t_0, Tb) \qquad (B8)$$

The equation (B6) can be transformed as follows:

$$\begin{aligned} Ei' &= \int rL'\, Gei'(t)\, dt \qquad (B9)\\ &= rL' \int Gei'(t)\, dt \\ &= r(L'/L)L \int Gei'(t)\, dt \\ &= (L'/L) \int rL\, Gei'(t)\, dt \end{aligned}$$

If the phase encoding coefficients K shown in FIG. 11 are the values determined when $$L' = L_0$$

the phase encoding amounts Ei will then be:

$$\begin{aligned} Ei &= \int rL_0\, Gei(t)\, dt \qquad (B10)\\ &= (L_0/L) \int rL\, Gei(t)\, dt \end{aligned}$$

If the values of the phase encoding amounts Ei' and Ei given by the equations (B9) and (B10) are made to be equal without regard to the position within the sample 1, the relative position of the imaging region of the sample 1 does not change within the field of view L, and the artifacts in the slice image can be restrained.

The equation (B9) can be transformed as follows:

$$\begin{aligned} Ei' &= (L'/L) \int rL\, Gei'(t)\, dt \qquad (B11)\\ &= [L'/(L'/L_0)L] \int r(L'/L_0)L\, Gei'(t)\, dt \\ &= (L_0/L) \int r(L'/L_0)L\, Gei'(t)\, dt \end{aligned}$$

When this equation is compared with the equation (B10) it will be seen that the field of view L is varied by $L'/L_0$ times. If the phase encoding magnetic field Gei'(t) is so set as to satisfy $$(L'/L_0) Gei'(t) = Gei(t) \qquad (B12)$$

the phase encoding amounts Ei and Ei' given by the equations (B10) and (B11) become equal.

From the equation (B12), $$Gei'(t) = (L_0/L')Gei(t) \quad (B13)$$

It will be seen from the equation (B13) that the i-th phase encoding magnetic field $Gei'(t)$ to be actually applied is equal to $(L_0/L')$ multiplied by the phase encoding magnetic field $Gei(t)$ used in the prior art. The correction factor $\alpha i = L_0/L'$ will then be given as follows:

$$\begin{aligned}
\alpha i &= L_0/L' \quad (B14)\\
&= L_0/[L_0 + Lb \cdot f(t', t_0, Tb)]\\
&= 1/[1 + (Lb/L_0) \cdot f(t', t_0, Tb)]\\
&= 1/\{1 + (Lb/L_0) \cdot f[[(i-1) \, TR, t_0, Tb]]\}
\end{aligned}$$

Here, $\alpha 1 = 1$

The corrected phase encoding coefficients $K'$ can be obtained by successively multiplying the correction coefficients $\alpha i$ given by the equation (B14) by the phase encoding coefficient $Ki$ shown in FIG. 11 in accordance with:

$$\begin{aligned}
Ki' &= \alpha i \cdot Ki\\
&= \alpha i \cdot [(N/2) + 1 - i]/(N/2)
\end{aligned}$$

The results will be as shown in FIG. 13.

Where the phase encoding coefficients $K'$ in FIG. 13 are used to determine the phase encoding magnetic field $Gei(t)$, if the end region $L'$ of the sample 1 is enlarged so that $$L' > L_0$$

then $$\alpha i < 1$$

and the phase encoding magnetic field $Gei'(t)$ will be smaller than the phase encoding magnetic field $Gei(t)$ in the prior art. If, on the contrary the end region is reduced so that $$L' < L_0$$

then $$\alpha i > 1$$

and the phase encoding magnetic field $Gei'(t)$ will be larger than the phase encoding magnetic field $Gei(t)$ in the prior art.

In this way, the field of view L is changed by $(L'/L_0)/L$ responsive to the body movement of the sample 1, and the phase encoding magnetic field $Gei'(t)$ satisfying the condition of the equation (B1) is determined, and a phase encoding magnetic field $Gei'(t)$ which is a product of the prior-art phase encoding magnetic field $Gei(t)$ by $L_0/L'$ is applied, then a predetermined phase encoding amount E is applied to the imaging region of the sample 1, and the relative position of the imaging region can be kept unchanged.

In the embodiment described above, to correct the field of view L, the average position $L_0$ of the sample 1 during application of the phase encoding magnetic field is used. But if the equation (B6) is integrated in accordance with the movement of the sample 1, the end region $L'$ is calibrated and correction can be achieved with an even higher accuracy, and the effect of restraining the artifacts is improved.

In the embodiment described, the correction coefficients $\alpha i$ are obtained from advance measurement of the body movement of the sample 1. But the imaging region of the sample 1 may be measured during application of the phase encoding magnetic field and used for correction of the phase encoding coefficients K.

It is also possible to display the movement of the sample on the basis of the signals from the body movement sensor to monitor the body movement.

In the embodiment described, the correction coefficients $\alpha i$ are determined when the end region $L'$ is at the average position $L_0$. But the correction coefficients $\alpha i$ can be determined at any other region.

In the embodiment described, the two-dimensional Fourier transformation method is used to obtain a slice image from the NMR (nuclear magnetic resonance) signals. But the invention is applicable where the three-dimensional Fourier transformation method is used, or where the MR signals are electron spin resonance signals.

As has been described according to the embodiment of FIG. 11 to FIG. 13, the phase encoding coefficients are varied in accordance with the body movement of the sample so as to change the field of view, so that a predetermined phase encoding amount is applied to the imaging region in the field of view of the sample. As a result, the artifacts due to the body movement can be restrained.

Another embodiment will next be described with reference to FIG. 14. The MR system to which this embodiment is applied can be identical to that shown in FIG. 1. It is only necessary that the contents in the sequence controller 15 and the arithmetic operation program in the computer 16 be partially changed.

Figure 14:
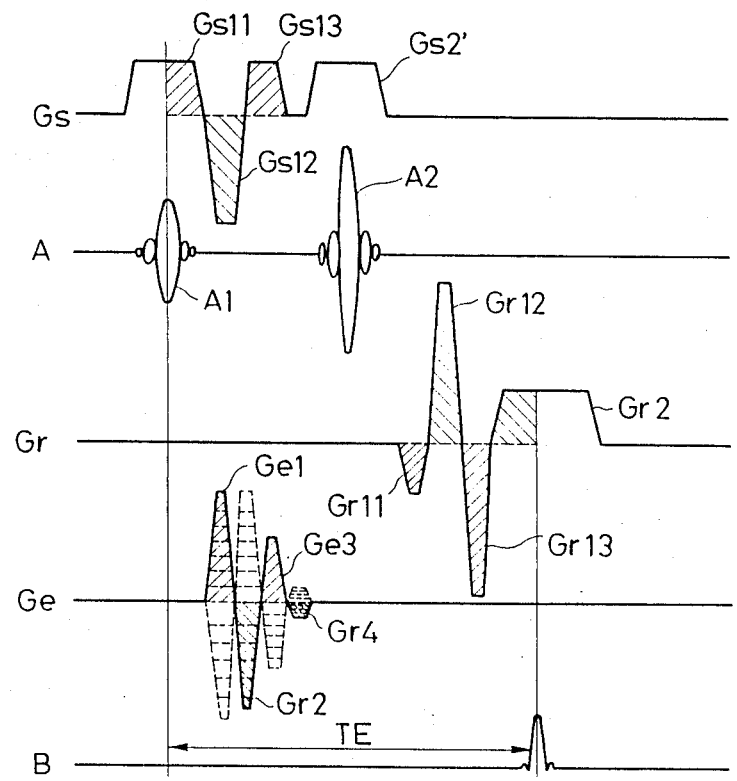
FIG. 14 is a pulse sequence diagram showing the operation of another embodiment of the MR imaging method according to the invention.

The embodiment shown in FIG. 14 is one in which the spin echo method is applied. It is identical to FIG. 3 except that the gradient magnetic fields Gs1, Gr1 and Ge are divided into a plurality of pulses.

In FIG. 14, which is a pulse sequence diagram, the waveforms of the slice magnetic fields Gs11 to Gs13 are so set as to correct the phases for the cases where the object nuclei are stationary and the cases where the object nuclei move at a constant velocity (up to the first-order movement of the sample 1). The waveforms of the signal reading magnetic fields Gr11 to Gr13 are so set as to correct the phases for the cases where the object nuclei are stationary, the cases where the object nuclei move at a constant velocity, and the cases where the object nuclei move at a constant acceleration (up to the second-order movement). The waveforms of the phase encoding magnetic fields Ge1 to Ge4 are so set as to correct the phases for the cases where the object nuclei are stationary, the cases where the object nuclei move at a constant acceleration, and the cases where the object nuclei move with a constant jerk (up to the third-order movement).

Generally, if the intensity of the gradient magnetic field pulse which varies with time is denoted by $G(t)$, while this gradient magnetic field pulse $G(t)$ is applied, the phase deviation $\phi$ of the NMR signals (nuclear spin) is given by:

$$\phi = \int r \, G(t) P(t) dt \quad (C1)$$

where r represents the gyromagnetic ratio.

P(t) represents the position of the object nuclei in the direction of the gradient magnetic field. When the movements up to the n-th order (0-th stands for the stationary state, the first-order stands for the movement at a constant velocity, the second-order stands for the movement at a constant acceleration, the third-order stands for the movement at a constant jerk, and so on) are considered:

$$P(t) = \frac{a_0}{0!} + \frac{a_1 t}{1!} + \frac{a_2 t^2}{2!} + \frac{a_3 t^3}{3!} + \ldots + \frac{a_n t^n}{n!} \quad (C2)$$

$a_0$ to $a_n$ represent the intensities of the n-th order movement.

Let us assume now that as shown in FIG. 14, the central position of the slice magnetic field Gs2' coincides with the central position of the RF pulse (180° pulse) A2, and let Gs(t) represent the slice magnetic fields Gs11 to Gs13 applied in accordance with the RF pulse (90° pulse) A1. Then, the phase deviation $\phi s$ due to the slice magnetic field Gs(t) can be represented by the definite integral from the central position of the RF pulse A1 to the end of the application of the slice magnetic field Gs(t):

$$\phi s = \int r\, Gs(t) Ps(t) dt \quad (C3)$$

where Ps(t) represents the position of the nucleus in the direction of the slice magnetic field.

If Gr(t) represents the signal reading magnetic fields Gr11 to Gr13 and Gr2 (hatched area) applied in accordance with the NMR signal B, then the phase deviation $\phi r$ due to the signal reading magnetic field Gr(t) is given by the definite integral from the commencement of the application of Gr(t) to the central position of the NMR signal B:

$$\phi r = \int r\, Gr(t) Pr(t) dt \quad (C4)$$

where Pr(t) represents the position of the nucleus in the direction of the signal reading magnetic field.

The phase deviation $\phi e$ due to the phase encoding magnetic field Ge(t) is given by the definite integral from the commencement to the end of the application of the phase encoding magnetic filed Ge(t):

$$\phi e = \int r\, Ge(t) Pe(t) dt \quad (C5)$$

where Pe(t) represents the position of the nucleus in the direction of the phase encoding magnetic field.

The phase deviation $\phi s$ due to the slice magnetic field Gs(t) given by the equation (C3) must equal to zero. That is, $$\int r\, Gs(t) Ps(t) dt = 0 \quad (C6)$$

Similarly, the phase deviation $\phi r$ due to the signal reading magnetic field Gr(t) given by the equation (C4) must equal to zero. That is, $$\int r\, Gr(t) Pr(t) dt = 0 \quad (C7)$$

The phase deviation $\phi e$ due to the phase encoding magnetic field Ge(t) given by the equation (C5) must equal to the i-th phase encoding amount Ki in the repetitive sequence. That is, the following relationship must be satisfied:

$$\int r\, Ge(t) Pe(t) dt = Ki \quad (C8)$$

If the movement up to the first-order in the direction of the slice magnetic field is considered, it will be seen from the equation (C2) that the position Ps(t) of the nucleus is given by the following equation:

$$Ps(t) = \frac{a_0}{0!} + \frac{a_1 t}{1!}$$

If this relation is substituted in the equation (C6), then:

$$\int r\, Gs(t)(a_0 + a_1 t) dt = 0 \quad (C9)$$

The pulse areas Ss11 to Ss13 (hatched area), with the polarities being taken account of, of the slice magnetic fields Gs11 to Gs13 satisfying the equation (C9) are related as follows:

$$Ss11 = -(\tfrac{1}{2})Ss12 = Ss13$$

So, $$Ss11:Ss12:Ss13 = 1:-2:1 \quad (C10)$$

From the equation (C10), the slice magnetic fields Gs11 and the slice magnetic field Gs13 are of the same polarity and have the same pulse area, and the slice magnetic field Gs12 has a polarity opposite to that of the slice magnetic field Gs11 and has a pulse area twice that of the slice magnetic field Gs11. Because the gradient magnetic fields are assumed to be trapezoidal-shaped, the pulse area substantially corresponds to the height of the pulse (magnetic field intensity).

When the movement up to the second order is considered, the position Pr(t) of the nucleus is given by $$Pr(t) = \frac{a_0}{0!} + \frac{a_1 t}{1!} + \frac{a_2 t^2}{2!}$$

If this relation is substituted in the equation (C7)

$$\int r\, Gs(t)\left(a_0 + a_1 t + \frac{a_2 t^2}{2}\right) dt = 0 \quad (C11)$$

The pulse areas Sr11 to Sr13 and Sr2 (hatched area), with the polarities being taken account of, of the signal reading magnetic fields Gr11 to Gr13 and Gr2 satisfying the equation (C11) are related as follows:

$$Sr11 = -(\tfrac{1}{3})Sr12 = (\tfrac{1}{3})Sr13 = -Sr2$$

So, $$Sr11:Sr12:Sr13:Sr2 = -1:3:-3:1 \quad (C12)$$

From the equation (C12), the signal reading magnetic fields Gr11 and the signal reading magnetic field Gr2 have polarities opposite to each other and have the same pulse area, and Gr12 and Gr13 have polarities (Gr13 and Gr11 have the same polarity) opposite to each other and have a pulse area three times that of Gr11.

Furthermore, when the movement up to the third-order in the direction of the phase encoding magnetic field is considered, the position Pe(t) of the nucleus is given by $$Pe(t) = \frac{a_0}{0!} + \frac{a_1 t}{1!} + \frac{a_2 t^2}{2!} + \frac{a_3 t^3}{3!}$$

If this relation is substituted in the equation (C8), then:

$$\int r\, Ge(t) \left( a_0 + a_1 t + \frac{a_2 t^2}{2} + \frac{a_3 t^3}{6} \right) dt = 0 \quad (C13)$$

The pulse areas Sp1 to Sp4 of the phase encoding magnetic fields Ge1 to Ge4 satisfying the equation (C13) are related as follows:

$$(12/25)Sp11 = -(12/23)Sp2 = (12/13)Sp3 = -4Sp4$$

So, $$Sp1:Sp2:Sp3:Sp4 = 25/12:-23/12:13/12:-\tfrac{1}{4} \quad (C14)$$

The relationship of the expression (C14) always holds even when the phase encoding amounts Ki varies.

By setting the pulse areas so as to compensate for the phase deviations for the movement up to the necessary order n, the phase disorder due to the movement of the sample 1 is eliminated, and the artifacts due to the phase disorder of the slice images can be restrained. The compensation for the phase disorder can be effected for any arbitrary gradient magnetic field direction which is required in accordance with the movement of the sample 1.

In the embodiment described with reference to FIG. 14, the waveforms of the gradient magnetic fields are trapezoidal in shape. Alternatively, sinusoidal waveforms or any other waveforms may be used, as long as the relationships (C10), (C12) and (C14) are satisfied.

Description has been given with reference to the case in which the movement up to the first-order in the direction of the slice magnetic field is compensated, the case in which the movement up to the second-order in the direction of the signal reading magnetic field is compensated, and the case in which the movement up to the third-order in the direction of the phase encoding magnetic field is compensated. By setting the pulse areas to satisfy the relationships (C6) to (C8), phase disorder for the movement up to any order n can be compensated.

Figure 3:
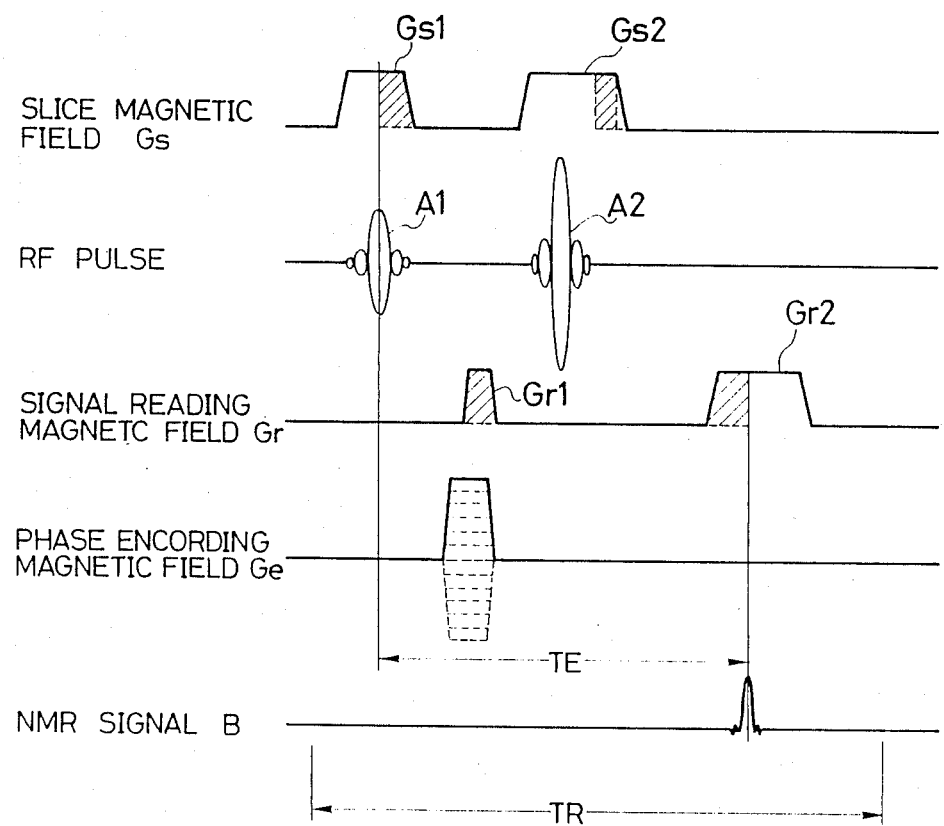
FIG. 3 is a pulse sequence diagram showing the operation of another example of the prior art MR imaging method.

In the embodiment described, the signal reading magnetic fields Gr11 to Gr13 are applied immediately before the collection of the NMR signals B. But they may be applied between the RF pulses A1 and A2, as illustrated in FIG. 3. The phase deviations due to the signal reading magnetic fields Gr11 to Gr13 are equal to Gr2 (hatched area), and the pulse areas will have the following relationship:

$$Sr11:Sr12:Sr13 = 11:-7:2$$

In the embodiment described, the two-dimensional Fourier transformation method is used to obtain the slice image from NMR signals B. Alternatively, the three-dimensional Fourier transformation method may be used. Moreover, electron spin resonance signals may be used instead of the NMR signals.

In the embodiment described, the NMR signals B are collected by the spin echo method. But the invention is also applicable to the cases where the gradient field echo method is used as shown in FIG. 15.

Figure 15:
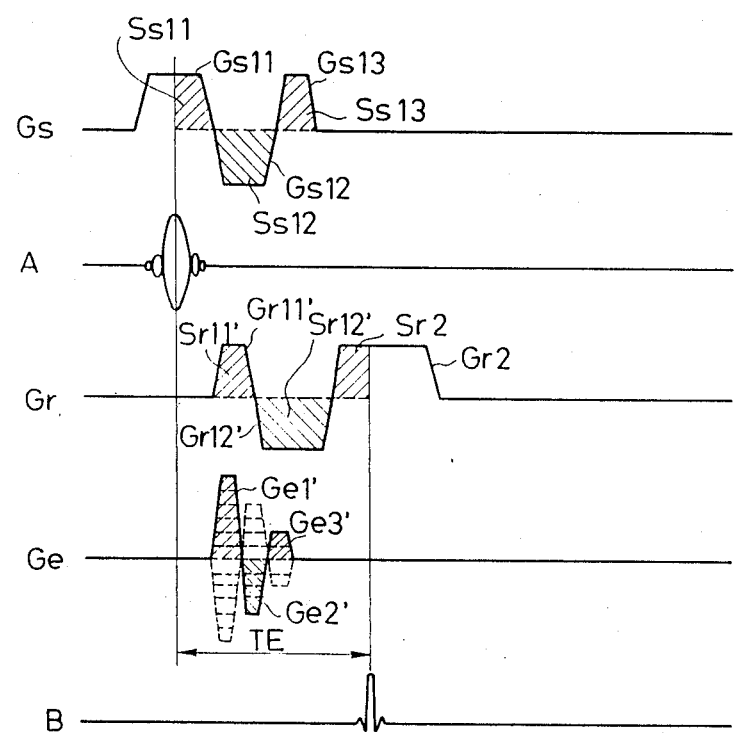
FIG. 15 is a pulse sequence diagram showing the operation of another embodiment of the MR imaging method according to the invention.

In the case of FIG. 15, the movement up to the first order is considered for the slice magnetic field and the signal reading magnetic field, while the movement up to the second order is considered for the phase encoding magnetic field. Accordingly, the pulse areas of the slice magnetic fields Gs11 to Gs13 (hatched areas) are related as follows:

$$Ss11':Ss12':Ss13 = 1:-2:1$$

The pulse areas of the signal reading magnetic fields Gr11', Gr12' and Gr2 (hatched areas) are related as follows:

$$Sr11':Sr12':Sr2' = 1:-2:1$$

The pulse areas of the phase encoding magnetic fields Gr1', Gr2' and Ge3' (hatched areas) are related as follows:

$$Sp1':Sp2':Sp3' = 11:-7:2$$

As has been described according to the embodiments described with reference to FIG. 14 and FIG. 15, at least one of the slice magnetic field Gs(t) applied in accordance with the RF pulse, the signal reading magnetic field Gr(t) applied in accordance with the NMR signal, and the phase encoding magnetic field Ge(t) is divided into a plurality of pulses, and the polarities and the pulse areas of the respective pulses are set so as to correct the phase disorder due to the movement of the sample. As a result, the artifacts in the slice image are restrained and the quality of the image is improved.

Another embodiment of the invention will be described with reference to FIG. 16. This embodiment aims to enable imaging of flow velocity, flow rate, acceleration, the force (spin amount x acceleration), jerk, etc.

The system that is used for the implementation of the embodiment can be identical to that shown in FIG. 1. The embodiment can be implemented by changing part of the programs stored in the sequence controller 15 or adding new programs. FIG. 16 is a timing chart showing outputs produced by means of the program, for example stored in the computer 16.

Figure 16:
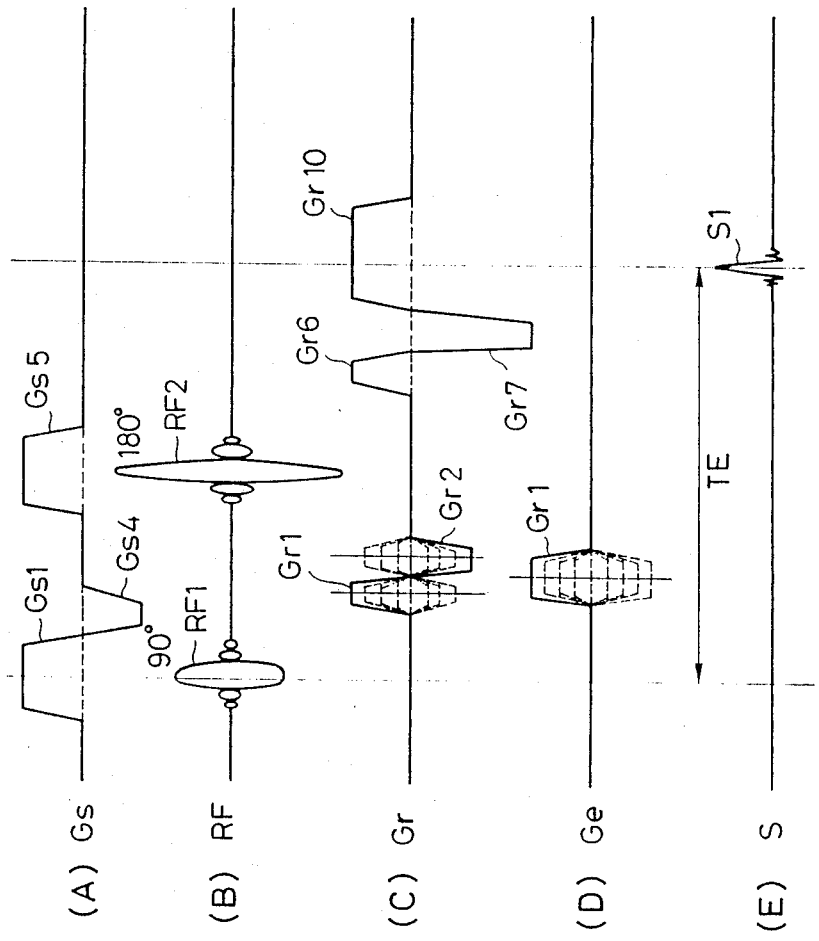
FIG. 16 is a pulse sequence diagram showing the operation of another embodiment of the MR imaging method according to the invention.

In FIG. 16, the slice magnetic field waveform Gs for designating the slice plane, the RF pulse waveform RF for applying energy to the object spins, the signal reading magnetic field waveform Gr, the phase encoding magnetic field waveform Ge and the MR signal S are shown at (A), (B), (C), (D) and (E), respectively.

It is assumed that the time derivative of the position is present only in the direction of the Gr, and first-order time derivative (velocity) of the position is imaged. A phase deviation proportional to the velocity is given, and the imaging is effected by a two-dimensional Fourier transformation method, and the velocity is obtained by Fourier transformation on the respective pixels. It is also assumed that the signals are produced by the spin echo method.

Figure 4:
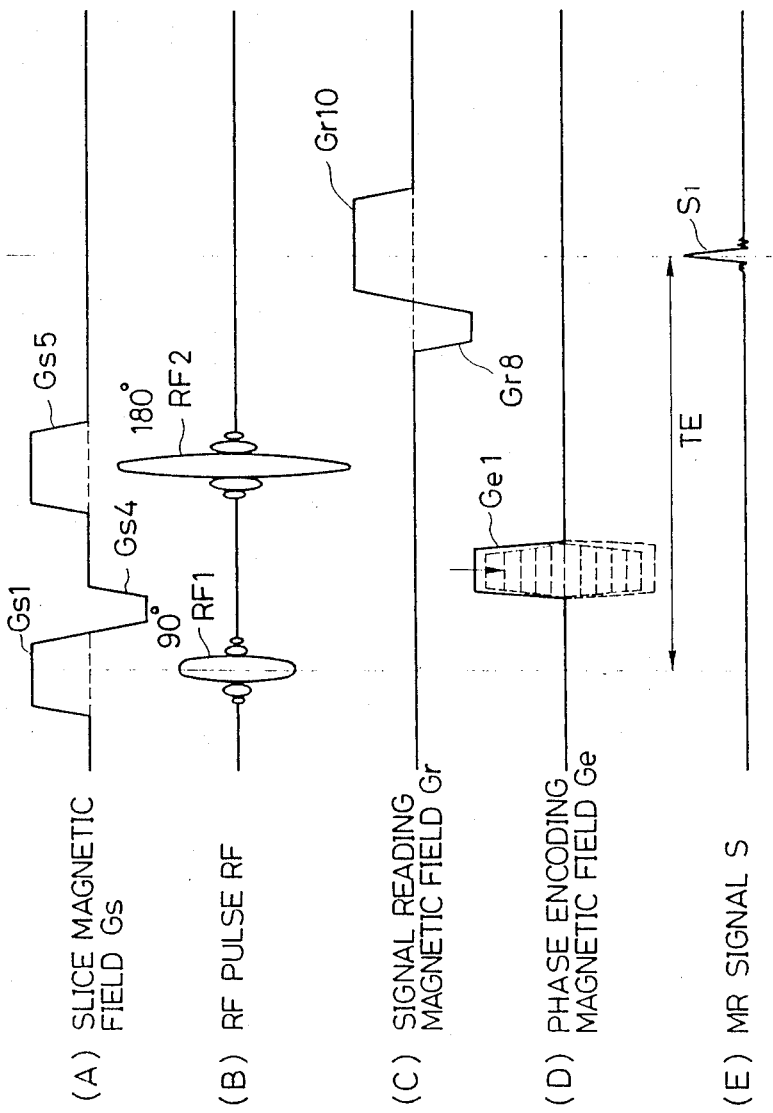
FIG. 4 is a pulse sequence diagram showing the operation of another example of the prior art MR imaging method.

The method of collection of the signals is identical to that in the prior art described with reference to FIG. 4. The method of applying the signal reading magnetic field is different. The part which is different will be described.

After irradiation with the 90° RF pulses RF1, the phase deviation proportional to the velocity is applied to the gradient magnetic fields Gr1 and Gr2. While all the image data are collected (while Ge is applied a predetermined number of times, being varied by a predetermined value each time), the intensities of Gr1 and Gr2 are fixed. When a 180° RF pulse RF is applied, signal reading magnetic fields Gr6, Gr7, and Gr10 are applied to produce MR signals without causing phase deviation in the velocity so that spin echo signals S1 are collected. Details of the functions of Gr1, Gr2, Gr6, Gr7 and Gr10 will be described later. Responsive to the signal reading magnetic fields Gr1 and Gr2, the phase encoding magnetic field Ge1 is applied a predetermined number of times at a fixed time interval, being varied each time, to collect the signal S1: When the signals required for the construction of the slice image have been collected, the values of Gr1 and Gr2 are changed, and Ge1 is similarly varied to collect signals for the same slice plane. Gr1 and Gr2 are all changed by a predetermined value to collect all the signals S1.

Figure 17:
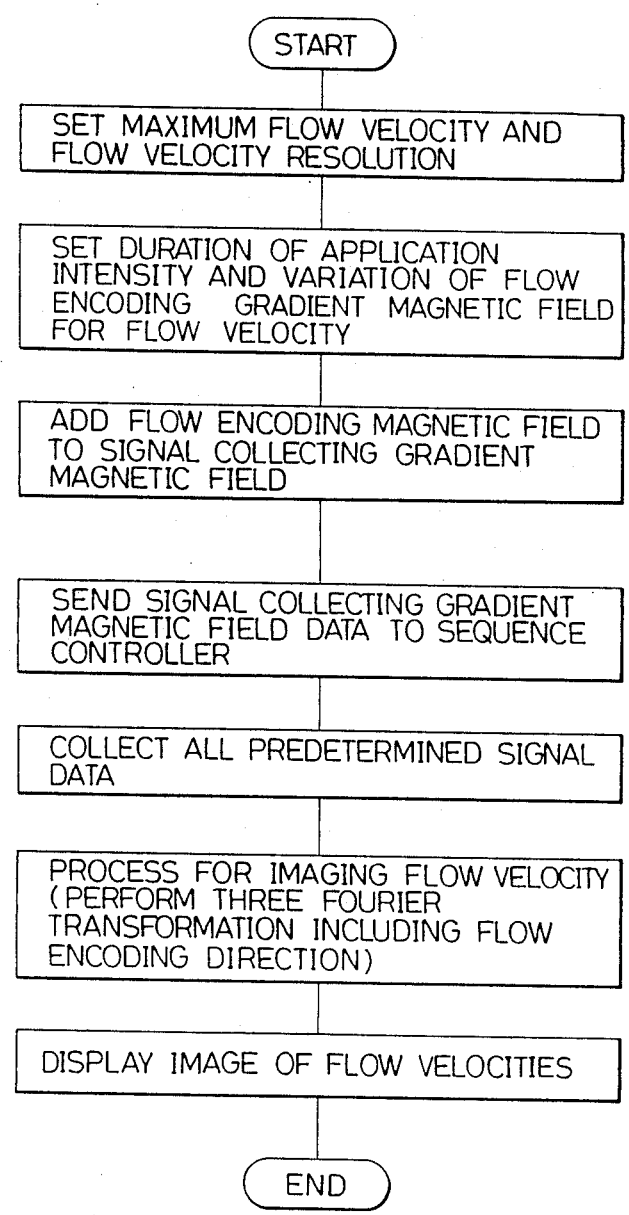
FIG. 17 is a flow chart showing the operation for determining the flow velocity.

To image the flow velocity, the signals are processed in a manner shown in FIG. 17. As a result of the processing, the flow velocity is displayed by means of brightness proportional to the flow velocity, or by means of numeric figures indicative of the value of the flow velocity. The phase deviation $\phi_{Vr}(x,y,z)$ is expressed by the following notation according to the parameters designated in FIG. 18.

$$\phi_{Vr}(x,y,z) = rv_r(x,y,z)\, gi \left( T + \frac{7}{3} T_1 \right) T_1 \tag{D4}$$

It will be seen from the equation (D4) that if the waveforms of Gr1 and Gr2 are maintained, phase deviations proportional to the velocity $V_r(x,y,z)$ can be given. Moreover, by varying the value of gi, the phase deviation for the same velocity can be controlled.

The functions of the waveforms of Gr6, Gr7 and Gr10 are described below. If $\phi_{vr}(x,y,z)$ represents the phase deviation of those having a fixed velocity $v_r(x,y,z)$ until the peak of S1 of Gr10 is generated, and $\phi_{vr}(x,y,z)$ represent the phase deviation of those being stationary, then:

$$\phi(x,y,z) = \int r\, Gr(t)\, dt \tag{D5}$$

$$\phi_{Vr}(x,y,z) = \int v_r(x,y,z)\, t\, Gr(t)\, dt \tag{D6}$$

where Gr(t) represents the Gr waveforms of Gr6, Gr7, and Gr10 up to the peaks of S1. It is assumed that the commencement of the application of Gr(t) is t=0, and it is so set that:

(Area of Gr6):(Area of Gr7):(Area of Gr10 up to the peak of S1)=1:−2:1 (D7)

(Intensity of Gr6):(Intensity of Gr7):(Intensity of Gr10)=1:−2:1 (D8)

First, the maximum flow velocity and the flow velocity resolution are designated. By the maximum flow velocity, the maximum value of Gr1 and Gr2 are designated, and by the flow velocity resolution, the variation amount and the number of variations are designated. The solid line of Gr1 and Gr2 in FIG. 16 indicates Gr waveforms for the maximum flow velocity, and the Gr waveforms are applied with its peak value being varied as indicated by the arrows, and the variation of the peak value is determined by the number of applications and the flow velocity resolution. In the case illustrated, the flow velocity resolution is 8 (the number of steps or points within the range of measurement is 8) and the peak value is reduced with a predetermined ratio.

Then, the intensity and duration of application of the gradient magnetic field waveform giving flow encoding to the flow velocity (giving phase deviation proportional to the flow velocity) are set. Gr1 and Gr2 are added to the signal collecting gradient magnetic field waveforms. The data of the timing chart of FIG. 16 are supplied to the sequence controller 15 and predetermined signal data are all collected. (The manner of collecting data is described above.) Then, the processing for obtaining the flow velocity is implemented. Fourier transformation is implemented on the respective pixels of the image obtained in accordance with the intensities of Gr1 and Gr2. The data are divided into 8 values equally dividing the range from +1 (corresponding to the maximum flow velocity) to $-\frac{3}{4}$, i.e., +1, +$\frac{3}{4}$, +2/4, +$\frac{1}{4}$, 0, −$\frac{1}{4}$, −2/4 and −$\frac{3}{4}$. Pixels corresponding to the respective velocities are collected, and the image corresponding to the respective flow velocities is formed, and the values of the respective pixels give the density of the flow velocity, and the density variation is represented by the brightness variation in the image on the display device.

Figure 18:
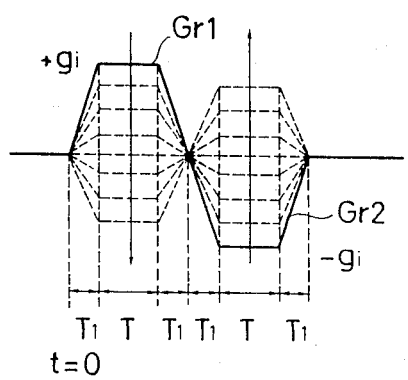
FIG. 18 is a diagram showing the waveform of the flow encode magnetic field.

The functions of the flow encoding magnetic field Gr1 and Gr2 are as follows: FIG. 18 shows Gr1 and Gr2 in FIG. 16. If a fixed velocity in the direction of Gr is represented by Vr(x,y,z), the values of Gr1 and Gr2 are denoted by +gi and −gi, and the gyromagnetic ratio of the object spins is denoted by r, the phase deviation $\phi_{vr}(x,y,z)$ of the object spins when the flow encoding magnetic fields Gr1 and Gr2 are applied is given by:

$$\phi(x,y,z) = \int r v_r(x,y,z)\, t\, G(t)\, dt \tag{D1}$$

where Gr1 and Gr2 are indicated by G(t).

The waveform of G(t) is a isosceles trapezoid as shown in FIG. 18, in which the rising time and falling time are both T1, and the flat part (upper bottom) is T. If the time of commencement of application is the origin, the equation (D1) can be written as follows:

$$\phi_{Vr}(x,y,z) = \int_0^{2T+4T_1} r\, V_r(x,y,z)\, t\, G(t)\, dt \tag{D2}$$

$$= r\, v_r(x,y,z) \int_0^{2T+4T_1} t\, G(t)\, dt$$

The equation (D2) can be transformed as follows:

$$\phi_{Vr}(x,y,z) = r\, V_r(x,y,z) \Bigg\{ \int_0^{T_1} t \cdot (gi/T_1)\, t\, dt + \int_{T_1}^{T+T_1} t \cdot gi\, dt + \int_{T+T_1}^{T+3T_1} t \cdot (-gi/T_1)(t - T - 2T_1)\, dt + \int_{T+3T_1}^{2T+3T_1} -t \cdot gi\, dt + \int_{2T+3T_1}^{2T+4T_1} t \cdot \tag{D3}$$

-continued $$(gi/T_1)(t - 2T - 4T_1) dt \Bigg\}$$

$$\phi(x,y,z) = \int r \, Gr(t) \, dt = 0 \tag{D9}$$

$$\phi_{Vr}(x,y,z) = \int r \, v_r(x,y,z) \, t \, Gr(t) \, dt = \tag{D10}$$

$$r \, V_R(x,y,z) \, gi \left( T + \frac{7}{3} T_1 \right) T_1$$

This means that when the echo signals are generated, signals can be collected, including the flow velocity, by use of the signal reading magnetic field Gr.

To resolve the flow velocity into N points, the intensity gi of G(t) is varied so that $$\int r \, v_m \, t \, G(t) \, dt = 2n\pi \tag{D11}$$

$$n = N/2, (N/2) - 1, \ldots 1, 0, -1, \ldots (-N/2) + 1$$

where $v_m$ represents the maximum velocity of $v_r(x,y,z)$; then phase deviation by $2\pi$ with respect to the maximum velocity $v_m$ can be obtained.

This is the same configuration as the equations for resolving the object spins in the direction of the slice thickness in the three-dimensional Fourier transformation method. This means that by performing the Fourier transformation on the signal intensity for the respective pixels corresponding to the respective values of gi, the velocity for the respective pixels can be resolved into the velocity for the respective pixels. This method is employed for the calculation of the flow velocity in FIG. 17. In this way, an image having the respective velocity components with a resolution of $v_m/(N/2)$ can be obtained.

Figure 20:
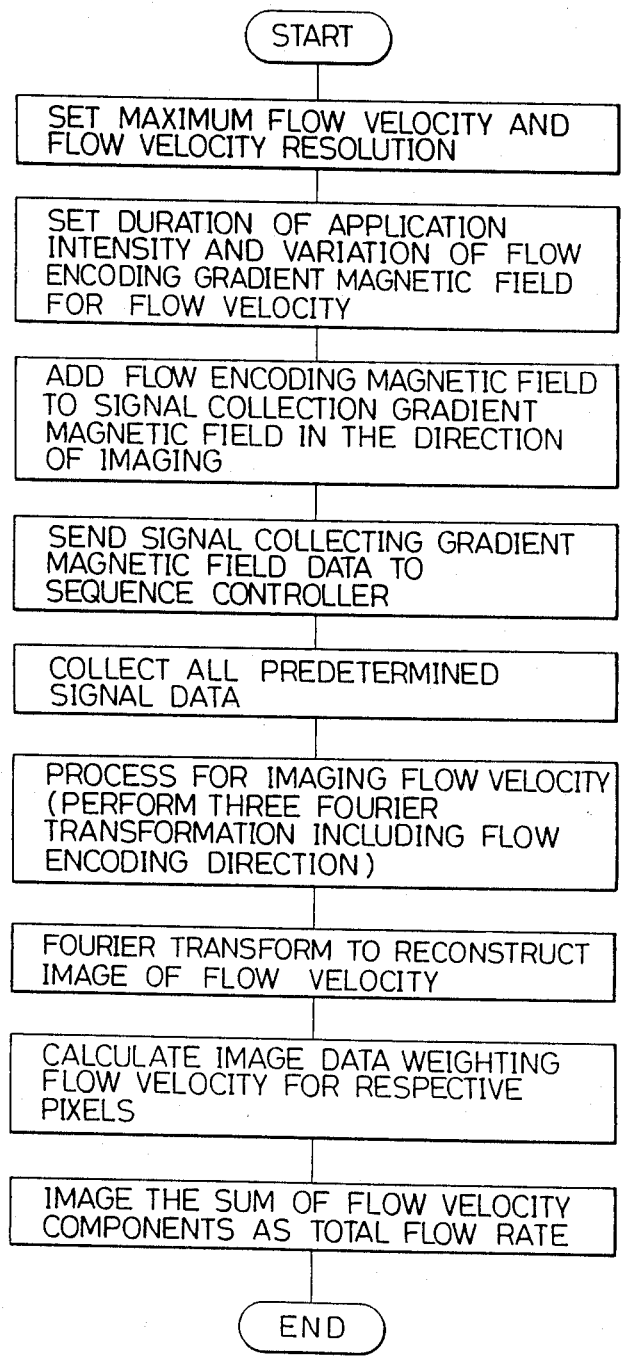
FIG. 20 is a flow chart showing the operation for determining the flow rate.

FIG. 20 is a flow chart showing processing for imaging the product (which represents the flow rate) of the object spin density and the time derivative of the object spin position in another embodiment of the invention.

FIG. 20 shows a case in which a first-order derivative of the position, i.e., the velocity is multiplied with the object spin density. The system that is used for the implementation of the method can be identical to that shown in FIG. 1, and the various signals can be applied in the same manner as shown in the timing chart of FIG. 16. The imaging of the flow rate can be achieved by modifiying part of the program of the computer 16.

The function of FIG. 20 will now be described. The procedure for determining the flow velocity is identical to that shown in FIG. 17. The signals can be collected in the same manner. The flow rate V is given by:

$$V = \sum_i v_i \, m_i \tag{D13}$$

where $v_i$ represents the velocity;

$m_i$ represents the object spin density of the velocity vi; and $\Sigma$ indicates summation over all the velocity values.

The values of V are determined for the respective pixels, and the image representing the variation of the flow rate or the absolute values of the flow rate is thereby formed.

In the embodiments described, Gr1 and Gr2 are applied between the 90° pulse and 180° pulse. Alternatively, Gr1 and Gr2 may be applied after the 180° pulse and before Gr6. Yet, a similar result is obtained, although it is necessary in this case to reverse the polarity of Gr6 and Gr7 in order to achieve the same velocity resolution. Moreover, depending on the velocity to be determined, the polarity of Gr1 and Gr7 may be reversed, positive and negative velocities can be resolved inversely.

Moreover, the phase encoding magnetic field Ge is applied between the 90° pulse and the 180° pulse. However, it may be applied after the 180° pulse and before Gr10, and yet a similar effect can be obtained. In order to obtain the image of the same orientation, the polarity of Ge1 must be reversed, and it is necessary to apply $-Ge1$ first.

In the embodiment described, the velocity is resolved by the spin echo method. But a gradient magnetic field echo method with the 180° pulse RF2 and the slice magnetic field Gs5 then applied being removed may be used to produce a similar result.

The method of constructing three Gr6, Gr7 and Gr10 of signal reading magnetic fields Gr has been described. But, a method of collecting echo signals by inversion of Gr may be employed, yet a predetermined phase deviation offset is added to the flow velocity, so that a similar result is obtained.

Moreover, description is made on the flow velocity in the direction of the signal reading magnetic field, but a similar result is obtained in connection with the flow velocities in the phase encoding direction and the slice direction by applying flow encoding magnetic fields (corresponding to Gr1 and Gr2) to the respective gradient magnetic fields. When a flow encoding magnetic field is applied in the direction of Gs and Ge, it is effective to use pulse patterns such as Gr6, Gr7 and Gr10 in order to align the phases of the object spins having the velocity components in the direction of Gs.

In the embodiment described, the amplitude ratio between Gr6, Gr7 and Gr10 of the Gr pattern is $1:-2:1$, but any other pattern by which the phase deviation is zero can be used in place.

Figure 19:
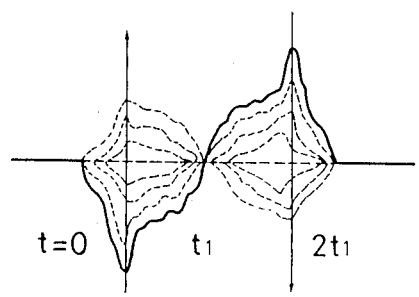
FIG. 19 is a diagram showing the waveform of another example of the flow encode magnetic field.

In the embodiment described, Gr1 and Gr2 have such patterns of isosceles trapezoidal waveforms arranged to give a point symmetry as shown in FIG. 18. As an alternative, any pair of positive going and negative going halfwaves which are arranged to give a point symmetry, as shown in FIG. 19, can be used in place.

Moreover, any flow encoding waveform giving a predetermined phase deviation for the flow velocity may be used in place.

The above description relates to the flow velocity. To image a quantity with a higher-order time derivative of the position of the object spins (e.g., second-order derivative which is an acceleration, or a third-order derivative which is a jerk), a gradient magnetic field which gives a predetermined phase deviation to the particular derivative may be used.

The above description relates to cases in which the phase deviation of the maximum flow velocity is changed by 2 at a time, and the velocity is calculated by means of the Fourier transformation in the direction of the pixels. If the value of gi is so chosen that the maximum flow velocity gives the phase deviation of more than $\pm 2\pi$, the flow velocity can be calculated directly from the phase deviation. Moreover, if the intensity of the gradient magnetic field waveform is so chosen that the maximum value is not more than $\pm 2\pi$ for a higher-order time derivative of the position of the object spins, the higher-order time derivative can be directly calculated from the phase deviation.

If the number of variation of the flow encoding magnetic field is $2^n$ (n: a positive integer) then the velocity resolution can be implemented by FFT (Fast Fourier Transformation).

As to the method of determining the flow rate, similar modifications may be made.

As has been described, according to the embodiments described with reference to FIG. 16 to FIG. 20, a control gradient magnetic field is so formed as to give a phase deviation proportional to the time derivative of the position of the object spins. As a result, the time derivative of the position of the object spins and the product of the time derivative of the position of the object spins and the density of the object spins can be readily imaged. A multi-functional diagnosis can be achieved by variation of the program alone and diagnosis of vascular vessels system and the like can be accomplished with ease.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of NMR or ESR, or the like imaging in which an RF magnetic field pulse, a slice magnetic field, a phase encoding magnetic field and a signal reading magnetic field are applied to a sample in a predetermined sequence, for the construction of a desired slice image on the basis of a magnetic resonance signal from the sample, comprising the steps of:

applying a first signal reading magnetic field having a predetermined pulse area;

applying a second signal reading magnetic field having a pulse area twice that of said predetermined pulse area and having a polarity opposite to that of said first signal reading magnetic field; and applying a third signal reading magnetic field having the same polarity as that of said first signal reading magnetic field, said steps of applying said first signal reading magnetic field, applying said second signal reading magnetic field and applying said third signal reading magnetic field are performed in the interval from the application of the RF magnetic field pulse and until a magnetic resonance signal is obtained, and the peak value of said magnetic resonance signal is obtained when the pulse area of said third signal reading magnetic field becomes equal to said predetermined pulse area.

2. A method of magnetic resonance imaging for constructing a desired slice image of a sample in an imaging region on the basis of magnetic resonance signals, said method comprising the steps of:

repeating a sequence comprising applying an RF magnetic field pulse, a slice magnetic field, a phase encoding magnetic field and a signal reading magnetic field, and collecting the magnetic resonance signals from the sample;

varying phase encoding coefficients in accordance with body movement of the sample, said phase encoding coefficients determining phase encoding amounts; and applying said determined phase encoding amounts to the imaging region in a field of view of the sample, whereby the relative position of the imaging region is maintained.

3. A method of magnetic resonance imaging comprising the steps of:

repeating a sequence including applying an RF pulse, a slice magnetic field, a signal reading magnetic field and a phase encoding magnetic field to a sample, and collecting MR signals from the sample;

varying a phase encoding amount Ki due to said phase encoding magnetic field responsive to the order of signal collection i; and constructing a slice image from said MR signals that have been collected, wherein at least one of a slice magnetic field Gs(t) applied in accordance with said RF pulse, a signal reading magnetic field GR(t) applied in accordance with said MR signal, and a phase encoding magnetic field Ge(t) is divided into a plurality of pulses, and the areas of the pulses with the polarity being considered are set as to satisfy, (a) with respect to said slice magnetic field Gs(t), the relationship on the integral from a central position of said RF pulse, $\int r\, Gs(t)\, Ps(t)\, dt = 0,$ (b) with respect to said signal reading magnetic field Gr(t), the relationship on the integral to a central position of said MR signals, $\int r\, Gr(t)\, Pr(t)\, dt = 0,$ and (c) with respect to the phase encoding magnetic field Ge(t), the relationship on the integral $\int r\, Ge(t)\, Pe(t)\, dt = Ki,$ where r represents a gyromagnetic ratio, and Ps(t), Pr(t) and Pe(t) represent components of the position of an object nucleus in the directions of the respective gradient magnetic fields.

4. A method of magnetic resonance imaging in which magnetic resonance is utilized, comprising imaging the time derivative of the position of object spins which move.

5. A method according to claim 4, wherein waveforms of a control gradient magnetic field applied for signal collection cause, to object spins, the phase deviation proportional to the time derivative of the position of the object spins.

6. A method according to claim 4, in which a slice image is formed by a Fourier transformation method.

7. A method according to claim 4, in which the time derivative of the position is determined from a phase deviation of the object spins proportional to the time derivative of the position of the object spins given by waveforms of a control gradient magnetic field for signal collection.

8. A method according to claim 4, in which phase deviation of the object spins proportional to the time derivative of the position of the object spins is measured at least twice, with the intensity of a control gradient magnetic field for signal collection being varied.

9. A method according to claim 4, wherein the time derivative of the position of the object spins are measured at least twice with the intensity of a control gradient magnetic field for signal collection giving a phase deviation proportional to a time variation amount of the position of the object spins being varied to produce a slice image, and the measurement is performed by Fourier transformation with respect to the phase deviation for respective pixels of the slice image.

10. A method according to claim 4, in which, in the image of phase deviation of the object spins, the time derivative of the position of the object spins are determined from phase deviation for respective pixels.

11. A method of magnetic resonance imaging comprising imaging a product of a time derivative of the position of object spins which move and spin density.

* * * * *